US012787235B2

(12) United States Patent
Jang et al.

(10) Patent No.: US 12,787,235 B2
(45) Date of Patent: Nov. 3, 2026

(54) ENERGY STORAGE SYSTEM

(71) Applicant: LG ELECTRONICS INC., Seoul (KR)

(72) Inventors: Heejoong Jang, Seoul (KR); Dongkeun Yang, Seoul (KR); Hyoungsuk Woo, Seoul (KR); Jihye Yi, Seoul (KR)

(73) Assignee: LG ELECTRONICS INC., Seoul (KR)

( * ) Notice: Subject to any disclaimer, the term of this patent is extended or adjusted under 35 U.S.C. 154(b) by 730 days.

(21) Appl. No.: 18/215,365

(22) Filed: Jun. 28, 2023

(65) Prior Publication Data

US 2024/0023294 A1 Jan. 18, 2024

(30) Foreign Application Priority Data

Jul. 12, 2022 (KR) ........................ 10-2022-0085582

(51) Int. Cl.
*H05K 7/20* (2006.01)
*H01M 10/42* (2006.01)
(Continued)

(52) U.S. Cl.
CPC ...... *H05K 7/20927* (2013.01); *H01M 10/425* (2013.01); *H01M 10/613* (2015.04);
(Continued)

(58) Field of Classification Search
CPC . H05K 7/20927; H01M 10/613; H01M 10/63
(Continued)

(56) References Cited

U.S. PATENT DOCUMENTS 5,960,861 A * 10/1999 Price .................... F28F 13/003 165/170
5,983,997 A * 11/1999 Hou ........................ F28F 3/027 257/722

(Continued)

FOREIGN PATENT DOCUMENTS

EP 3 965 207 A1 3/2022
KR 10-2018-0038301 4/2018

OTHER PUBLICATIONS

Extended European Search Report dated Dec. 20, 2023 issued in Application 23183511.7.

*Primary Examiner* — Zhengfu J Feng
(74) *Attorney, Agent, or Firm* — KED & ASSOCIATES, LLP

(57) ABSTRACT

An energy storage system may include a plurality of cooling plates disposed in contact with the plurality of semiconductor devices on a power conditioning system (PCS) circuit board, a cooling module including a pump for flowing a coolant, a first flow path connected to the cooling plates and the cooling module, through which a coolant discharged from the cooling module flows, and a second flow path connected to the cooling plates and the cooling module, through which a coolant discharged from the cooling plates flows. Each of the cooling plates includes an internal flow path including a first channel connected to the first flow path and a second channel connected to the first channel and the second flow path, and an area occupied by the first channel is larger than an area occupied by the second channel in a first area in contact with the semiconductor devices.

9 Claims, 20 Drawing Sheets

(51) Int. Cl.

| | |
|---|---|
| ***H01M 10/613*** | (2014.01) |
| ***H01M 10/63*** | (2014.01) |
| ***H01M 10/6554*** | (2014.01) |
| ***H01M 10/6556*** | (2014.01) |
| ***H01M 10/6568*** | (2014.01) |
| ***H10W 40/47*** | (2026.01) |
| *H02J 7/00* | (2006.01) |

(52) U.S. Cl.

CPC ....... *H01M 10/63* (2015.04); *H01M 10/6554* (2015.04); *H01M 10/6556* (2015.04); *H01M 10/6568* (2015.04); *H05K 7/20909* (2013.01); *H05K 7/20945* (2013.01); *H10W 40/47* (2026.01); *H01M 2010/4271* (2013.01); *H02J 7/875* (2026.01)

(58) Field of Classification Search

USPC .......................................................... 361/702

See application file for complete search history.

(56) References Cited

U.S. PATENT DOCUMENTS

| | | | | |
|---|---|---|---|---|
| 8,148,859 | B2 * | 4/2012 | Yoshida ................. | H02K 5/203 310/52 |
| 2010/0147492 | A1 * | 6/2010 | Conry ................. | F28D 15/0266 165/104.31 |
| 2010/0300646 | A1 | 12/2010 | Sawaguchi et al. | |
| 2016/0372805 | A1 | 12/2016 | Kim et al. | |
| 2022/0059886 | A1 | 2/2022 | Gréber | |
| 2022/0077549 | A1 | 3/2022 | Erhart et al. | |

* cited by examiner

ENERGY STORAGE SYSTEM

CROSS-REFERENCE TO RELATED APPLICATION

This application claims priority under 35 U.S.C. § 119 to Korean Application No. 10-2022-0085582 filed on Jul. 12, 2022, whose entire disclosure is hereby incorporated by reference.

BACKGROUND

1. Field

The present disclosure relates to an energy storage system, and more particularly, to a battery-based energy storage system.

2. Background

An energy storage system is a system that stores or charges external power and then externally outputs or discharges stored power. The energy storage system may include a battery, and a power conditioning system may be used for supply of power to the battery or output of power from the battery.

The energy storage system may include a power conditioning system that converts characteristics of electricity for charging or discharging a battery. The power conditioning system may include a circuit board and a plurality of semiconductor devices mounted on the circuit board. The semiconductor devices may generate a large amount of heat during operation, and thus may affect other semiconductor devices or the circuit board. Therefore, a structure is desired for separately cooling the semiconductor devices that generate a large amount of heat.

Korean Patent Application No. 10-2015-0189485, the subject matter of which is incorporated herein by reference, discloses a heat exchanger for cooling an electrical device, which is mechanically assembled through connection blocks while stacking cooling plates that form a coolant flow path and electrical devices, thereby facilitating insertion of the electrical devices and enabling pressing force between the cooling flow path and the electrical devices to increase, thereby improving cooling performance.

The above reference is incorporated by reference herein where appropriate for appropriate teachings of additional or alternative details, features and/or technical background.

BRIEF DESCRIPTION OF THE DRAWINGS

Embodiments may be described in detail with reference to the following drawings in which like reference numerals refer to like elements and wherein.

DETAILED DESCRIPTION

Figure 1A:
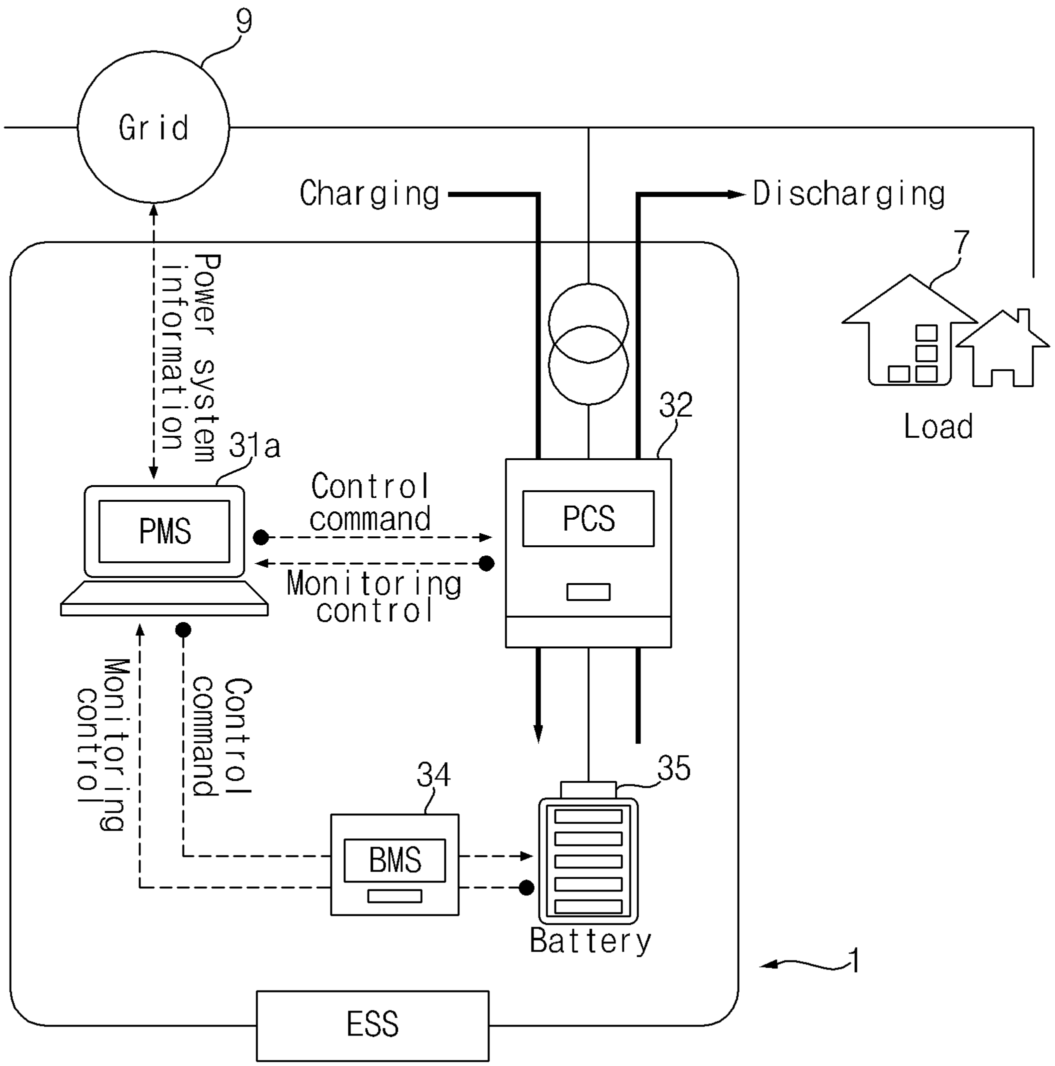
FIGS. 1A and 1B are conceptual views of an energy supply system including an energy storage system according to an example embodiment of the present disclosure.

Embodiments of the present disclosure may be described in detail with reference to the accompanying drawings. However, the present disclosure is not limited to these embodiments and may be modified in various forms. In the drawings, in order to clearly and briefly describe the present disclosure, illustration of parts irrelevant to the description is omitted, and the same reference numerals are used for the same or extremely similar parts throughout the specification.

The suffixes "module" and "unit" for components used in the following description are given only considering the ease of writing the present specification and do not give a particularly important meaning or role by itself. Accordingly, the terms "module" and "unit" may be used interchangeably.

Further, in this specification, terms such as "first" and "second" may be used to describe various elements, but these elements are not limited by these terms. These terms are only used to distinguish one element from another.

"Up (U)," "down (D)," "left (Le)," "right (Ri)," "front (F)," and "rear (R)" used in the drawings are for describing a battery pack and an energy storage system including the battery pack and may be set differently depending on standards.

Figure 1B:
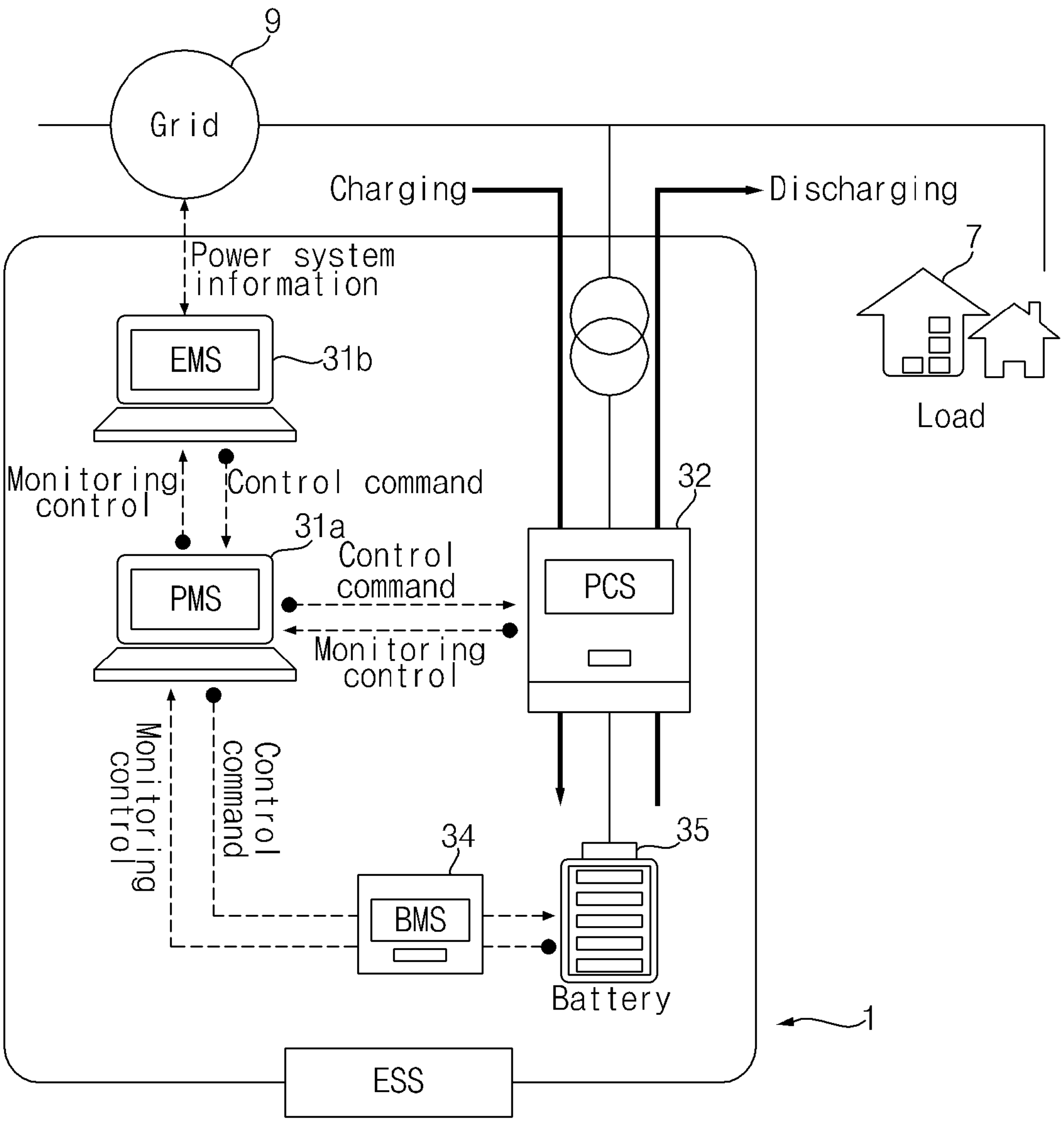

FIGS. 1A and 1B are conceptual views of an energy supply system including an energy storage system according to an example embodiment of the present disclosure. The energy supply system may include an energy storage system 1 based on a battery 35 in which electric energy is stored, a load 7 that is a power demander, and a grid 9 which may provide an external power supply source.

The energy storage system 1 may include the battery 35 that stores (charges) electric energy received from the grid 9 (or the like) in the form of direct current (DC) or outputs (discharges) the stored electric energy to the grid 9 (or the like), a power conditioning system (PCS) 32 for converting electrical characteristics (e.g., AC/DC interconversion, frequency, and voltage) for charging or discharging the battery 35, and a battery management system (BMS) 34 for monitoring and managing information such as current, voltage and temperature of the battery 35.

The grid 9 may include a power generation facility for generating electric power, a transmission line, and/or the like. The load 7 may be a demander that consumes power, and may include home appliances such as refrigerators, washing machines, air conditioners, TVs, robot cleaners, and robots, mobile electronic devices such as vehicles and drones.

The energy storage system 1 may store external power in the battery 35 and then output power to the outside. For example, the energy storage system 1 may receive DC power or AC power from the outside, store the same in the battery 35, and then output the DC power or AC power to the outside. Since the battery 35 mainly stores DC power, the energy storage system 1 may receive DC power or convert received AC power into DC power, store the DC power in the battery 35, convert the stored DC power into AC power, and supply the AC power to the grid 9 or the load 7.

The PCS 32 (in the energy storage system 1) may perform power conversion and charge a voltage in the battery 35 and/or supply DC power stored in the battery 35 to the grid 9 or the load 7.

The energy storage system 1 may charge the battery 35 based on power supplied from the grid and discharge the battery 35 when necessary. For example, the electric energy stored in the battery 35 may be supplied to the load 7 in an emergency (such as a power outage) or at a time, date, or season when the electric energy supplied from the grid 9 is expensive.

The energy storage system 1 may have the advantage of being able to improve safety and convenience of new and renewable energy generation by storing electric energy generated from a renewable energy source (such as sunlight) and be used as an emergency power source. When the energy storage system 1 is used, it is possible to achieve load leveling for a load having large fluctuations in time and season and reduce energy consumption and cost.

The BMS 34 may measure temperature, current, voltage, charge amount, and/or the like of the battery 35 and monitor the state of the battery 35. Further, the BMS 34 may control and manage the operation environment of the battery 35 such that it is optimized based on state information of the battery 35.

The energy storage system 1 may include a power management system (PMS) 31*a* that controls the PCS 32. The PMS 31*a* may execute a function of monitoring and controlling the states of the battery 35 and the PCS 32. The PMS 31*a* may be (or include) a controller that controls the overall operation of the energy storage system 1. The controller is a structural device that includes at least hardware.

The PCS 32 may control power distribution of the battery 35 according to a control command of the PMS 31*a*. The PCS 32 may convert power according to a connection state of the grid 9, a power generation means such as sunlight, the battery 35, and/or the load 7.

The PMS 31*a* may receive state information of the battery 35 from the BMS 34. The PMS 31*a* may transmit a control command to the PCS 32 and to the BMS 34.

The PMS 31*a* may include a communication means (or communication device) such as a Wi-Fi communication module (or device) and a memory. Various types of information necessary for operation of the energy storage system 1 may be stored in the memory. According to an embodiment, the PMS 31*a* may include a plurality of switches that may control a power supply path.

The PMS 31*a* and/or the BMS 34 may calculate the state of charge (SOC) of the battery 35 using various well-known SOC calculation methods, such as integrated charge current integration, state of charge (SOC) calculation based on an open circuit voltage (OCV). The battery 35 may overheat and irreversibly operate when the SOC exceeds a maximum SOC. Similarly, when the SOC is equal to or less than a minimum SOC, the battery may deteriorate and become irreversible. The PMS 31*a* and/or the BMS 34 may monitor the internal temperature and the SOC of the battery 35 in real time to control an optimal usage area and maximum input/output power.

The PMS 31*a* may operate under control of an energy management system (EMS) 31*b*, which may be a high-level controller. The PMS 31*a* may control the energy storage system 1 by receiving a command from the EMS 31*b*, and may transmit the state of the energy storage system 1 to the EMS 31*b*. The EMS 31*b* may be provided in the energy storage system 1 or may be provided in a higher system (or higher component) of the energy storage system 1.

The EMS 31*b* may receive information such as charge information, power usage, and environmental information, and may control the energy storage system 1 according to energy production, storage, and consumption patterns of a user. The EMS 31*b* may be provided as an operating system for monitoring and controlling the PMS 31*a*.

A controller for controlling overall operation of the energy storage system 1 may include the PMS 31*a* and/or the EMS 31*b*. The controller may be a structural device that includes hardware. According to an embodiment, one of the PMS 31*a* and the EMS 31*b* may also perform the function of the other one. In addition, the PMS 31*a* and the EMS 31*b* may be integrated into one controller, and may be integrally provided.

The installation capacity of the energy storage system 1 may vary according to customer's installation conditions, and a plurality of PCSs 32 and a plurality of batteries 35 may be connected to expand the installation capacity to a required capacity.

The energy storage system 1 may be connected to at least one power generator (FIG. 2) separately from the grid 9. The power generator 3 may include a wind power generator that outputs DC power, a hydraulic power generator that outputs DC power using hydraulic power, a tidal power generator that outputs DC power using tidal power, a thermal power generator that outputs DC power using heat geothermal heat, and/or the like. Hereinafter, for ease of description, a photovoltaic power generator may be described as the power generator 3.

Figure 2:
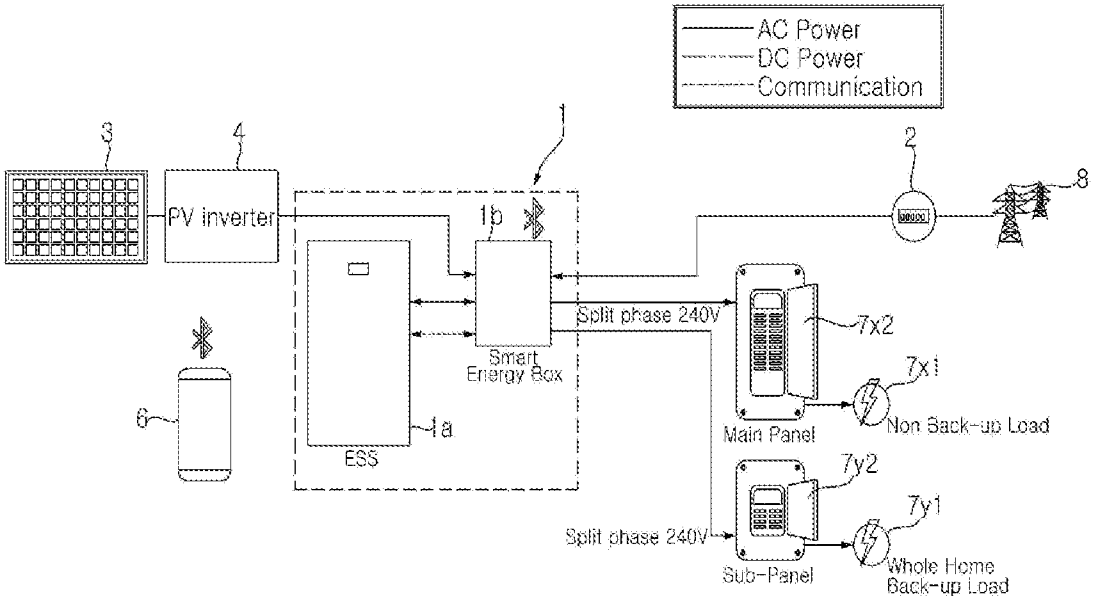
FIG. 2 is a conceptual view of a home energy service system including the energy storage system according to an embodiment of the present disclosure.

FIG. 2 is a conceptual diagram of a home energy service system including the energy storage system according to an example embodiment of the present disclosure. The energy storage system 1 may be connected to the system (or the grid 9) such as a power plant 8, a power generator such as a photovoltaic power generator 3, and a plurality of loads 7*x*1 and 7*y*1.

Electric energy generated by the photovoltaic power generator 3 may be converted in a PV inverter 4 (or inverter) and supplied to the grid 9, the energy storage system 1, and the loads 7*x*1 and 7*y*1. As described with respect to FIG. 3, the electric energy generated by the photovoltaic power generator 3 may be converted in the energy storage system 1 and supplied to the grid 9, the energy storage system 1, and the loads 7*x*1 and 7*y*1 according to the type of installation.

The energy storage system 1 may include one or more wireless communication modules and may communicate with a terminal 6. A user may monitor and control the state of the energy storage system 1 and the home energy service system through the terminal 6. The home energy service system may provide services based on a cloud, for example. The user can communicate with the cloud through the terminal 6 regardless of location, and monitor and control the state of the home energy service system.

According to an example embodiment, the above-described battery 35, the BMS 34, and the PCS 32 may be disposed inside one casing 12. The battery 35, the BMS 34, and the PCS 32 integrated in one casing 12 can store and convert power, and thus may be called an all-in-one energy storage system 1*a*, for example.

In a separate enclosure outside the casing 12, a configuration for power distribution such as the PMS 31*a*, an automatic transfer switch (ATS), a smart meter, and a switch, and/or a communication module for communication with the terminal 6, the cloud, and/or the like may be disposed. A configuration in which the components related to power distribution and management are integrated in one enclosure may be referred to as a smart energy box 1*b*.

The above-described PMS 31*a* may be accommodated in the smart energy box 1*b*. A controller for controlling the overall power supply connection of the energy storage system 1 may be disposed in the smart energy box 1*b*. The controller may be the PMS 31*a*.

Switches may be accommodated in the smart energy box 1*b* such that connection states of the connected power sources (such as the power plant 8 or the grid 9), the photovoltaic power generator 3, the battery 35 of the all-in-one energy storage system 1*a*, and the loads 7*x*1 and 7*y*1 can be controlled. The loads 7*x*1 and 7*y*1 may be connected to the smart energy box 1*b* through load panels 7*x*2 and 7*y*2 (such as a main panel and a sub-panel).

The smart energy box 1*b* may be connected to the grid power sources and the photovoltaic power generator 3. The automatic transfer switch (ATS) that is switched such that electric energy generated by the photovoltaic power generator 3 or stored in the battery 35 is supplied to a predetermined load 7*y*1 when a power outage occurs in the grids may be disposed in the smart energy box 1*b*.

Alternatively, the PMS 31*a* may perform the ATS function. For example, when a power outage occurs in the grids, the PMS 31*a* may control a switch (such as a relay) such that electric energy generated by the photovoltaic power generator 3 or stored in the battery 35 is supplied to a predetermined load 7*y*1.

A current sensor, a smart meter, and/or the like may be disposed on each current supply path. Electric energy generated through the energy storage system 1 and the photovoltaic power generator 3 may be measured and managed by the smart meter (i.e., at least a current sensor).

The energy storage system 1 according to an example embodiment may include at least the all-in-one energy storage system 1*a*. In addition, the energy storage system 1 may include the all-in-one energy storage system 1*a* and the smart energy box 1*b*, thereby providing integrated services for performing storage, supply, distribution, communication, and control of electric power simply and efficiently.

The energy storage system 1 may operate in a plurality of operation modes. In a PV self consumption mode, solar power may be first used in a load, and the remaining power may be stored in the energy storage system 1. For example, when the photovoltaic power generator 3 generates more power than the amount of power used by the loads 7*x*1 and 7*y*1 during the daytime, the battery 35 may be charged.

In a charge/discharge mode (based on a rate plan), four time periods may be set and input, the battery 35 may be discharged during a time period when the electric rate is high, and the battery 35 may be charged during a time period when the electric rate is low. The energy storage system 1 may help a user to save the electric charge in the charge/discharge mode based on a rate plan.

The backup-only mode may be a mode for emergency situations such as power outages, in which the battery 35 is charged to the maximum and power is supplied to the essential load 7*y*1 with highest priority in an emergency when a typhoon is expected in weather forecast or there is a possibility of other power outages.

Figure 3:
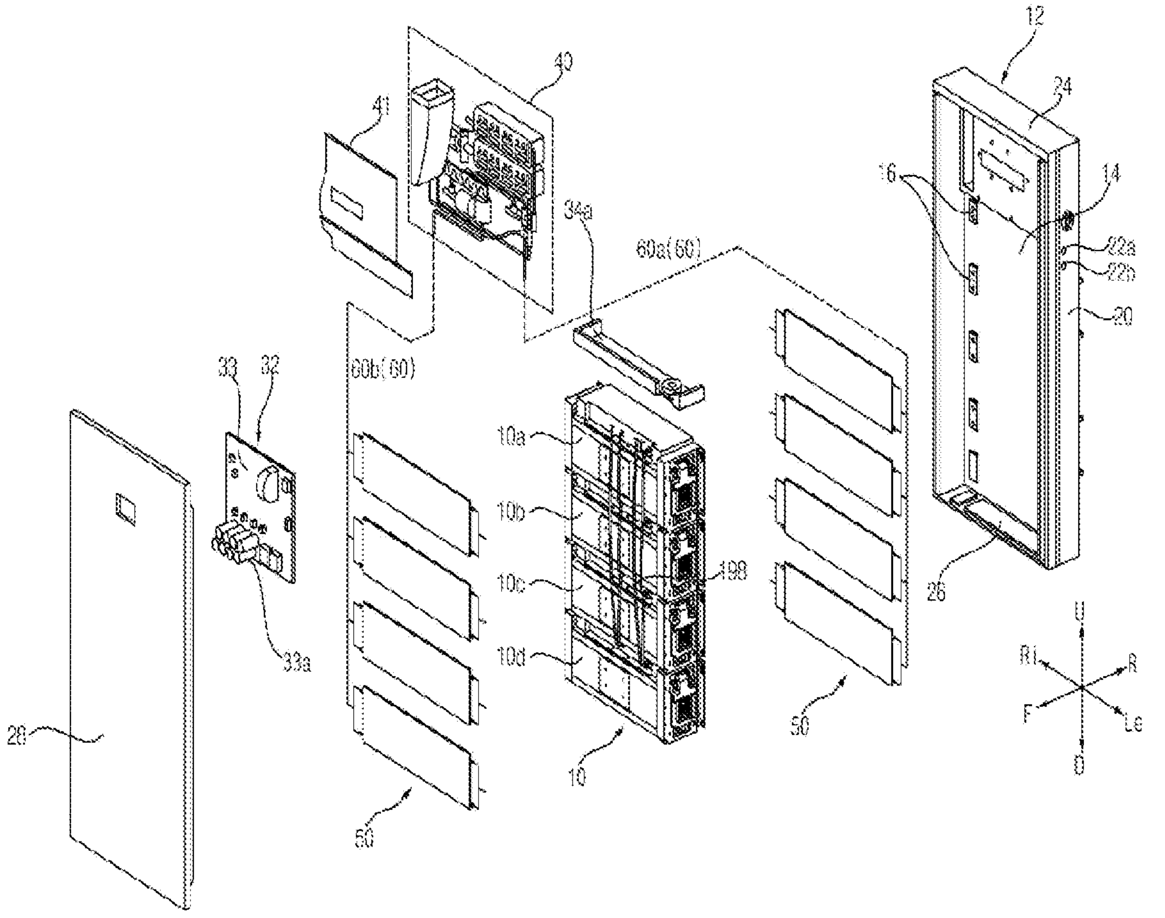
FIG. 3 is an exploded perspective view of an energy storage system that includes a plurality of battery packs according to an example embodiment of the present disclosure.

FIG. 3 is an exploded perspective view of an energy storage system that includes a plurality of battery packs according to an example embodiment of the present disclosure. Other embodiments and configurations may also be provided. The energy storage system 1 may include a plurality of battery packs 10 disposed in a vertical direction, a casing 12 forming a space in which the plurality of battery packs 10 are disposed, and a door 28 for opening and closing the front of the casing 12.

The casing 12 may have an open front side. The casing 12 may include a casing rear wall 14 covering the rear, a pair of casing sidewalls 20 extending forward from both ends of the casing rear wall 14, a casing top wall 24 extending forward from the upper end of the casing rear wall 14, and a casing base 26 extending forward from the lower end of the casing top wall 24. The casing rear wall 14 may include pack fastening parts 16 (or pack fasteners) to fasten the battery packs 10.

Switches 22*a* and 22*b* for turning on/off the power of the energy storage system 1 may be disposed on one of the pair of casing sidewalls 20. In an example embodiment, the first switch 22*a* and the second switch 22*b* may be disposed, and the power may be turned on only by a switching combination of the first and second switches 22*a* and 22*b* such that safety of the energy storage system 1 can be enhanced.

The PCS 32 for converting characteristics of electricity for charging or discharging the battery, and the BMS 34 for monitoring information such as the current, voltage and temperature of the battery packs 10 and/or battery cells included in the battery packs 10 may be disposed inside the casing 12.

The PCS 32 may include a circuit board 33 (or PCS circuit board) and a switching device (or a semiconductor device 33*a*) (e.g., an insulated gate bipolar transistor (IGBT)) disposed on one side of the circuit board 33 and performing power conversion.

The BMS 34 may include battery pack circuit boards disposed in (or at) the respective battery packs 10*a*, 10*b*,

10*c*, and 10*d*, and a main circuit board 34*a* connected to the plurality of battery pack circuit boards by communication lines.

The main circuit board 34*a* may be connected to the battery pack circuit board disposed at each of the plurality of battery packs 10*a*, 10*b*, 10*c*, and 10*d* through a communication line. The main circuit board 34*a* may be connected to a power line that extends from the battery pack 10.

The plurality of battery packs 10*a*, 10*b*, 10*c*, and 10*d* are disposed inside the casing 12. The battery packs 10*a*, 10*b*, 10*c*, and 10*d* may be disposed in the vertical direction. Each of the plurality of battery packs 10 is disposed such that it is fixed to the casing 12. Each of the plurality of battery packs 10*a*, 10*b*, 10*c*, and 10*d* is fastened to the pack fastening part 16 (or pack fasteners) provided on the casing rear wall 14.

Each battery pack 10 may include at least one battery module that includes a plurality of battery cells connected in series and parallel. For example, the battery pack 10 may include a battery module assembly including two battery modules electrically connected to each other and physically fixed. The battery module assembly may include a first battery module and a second battery module disposed to face each other. Each of the first and second battery modules may include a sensing substrate for sensing information on a plurality of battery cells, and the battery pack circuit boards may collect sensing information of the first and second battery modules from the sensing substrate and transmit the same to the BMS 34.

The energy storage system 1 according to an example embodiment may include the battery 35 capable of storing electricity, the PCS 32 in charge of input/output of the battery 35, and a thermal management system for controlling temperatures of internal components such as the battery 35.

The ESS thermal management system according to an example embodiment may be a water-cooled temperature control system for recovering waste heat generated from the battery 35, the PCS 32, a reactor, and/or the like when the system is driven, and for discharging the recovered waste heat to the outside to reduce the temperatures of the battery 35 and the PCS 32, thereby improving system efficiency. This system may compensate for low heat recovery efficiency of the existing air-cooled thermal management system, resulting in a high temperature of each component in the system. When the temperature of the battery is stably maintained within a certain temperature range during charging and discharging of the battery, there may be an advantage in that charging and discharging speeds may be increased, and thus the battery usage efficiency may be enhanced.

As a thermal management system, the energy storage system 1 may include a cooling module 40 (or cooling device) for cooling the internal components, such as the battery packs 10 and the PCS circuit board 33. According to an example embodiment, the cooling module 40 may cool the battery packs 10, the PCS circuit board 33, and/or the like based on a water cooling method (or liquid cooling method). For example, a battery cooling plate 50 (or coolant device) may be disposed to correspond to each battery pack 10, and a coolant may circulate between the cooling module 40 and the battery cooling plate 50 along a coolant flow path 60 to cool the battery packs 10. The coolant flow path 60 may include an inlet flow path 60*b* through which the coolant flows from the cooling module 40 to the battery cooling plate 50 (or battery cooling plates), and an outlet flow path 60*a* through which the coolant is discharged from the battery cooling plate 50 (or battery cooling plates) to the cooling module 40.

In consideration of problems of coolant supply and leakage, a coolant having insulating performance may be applied, and a coolant that can be used even at low temperatures may be preferable.

The cooling module 40 may include a pump for circulating the coolant, a heat exchanger and a fan for discharging waste heat recovered during system operation through heat exchange with air, cool the coolant heated according to waste heat recovery to the lowest atmospheric temperature, and circulate the coolant. The cooling module 40 may be supported by a plate 41 and may be in contact with the PCS circuit board or the like through the plate 41.

The thermal management system may include a battery-side water block (i.e., battery cooling plate 50), a PCS-side water block, a reactor-side water block, and/or the like for cooling parts other than the cooling module 40.

The battery-side water block is configured such that the number of battery-side water blocks increases in proportion to the number of battery modules applied, and the flow rate of the coolant may be normally uniformly provided to each water block. The water block formed for each heating element is configured to allow the coolant to flow inside and to recover waste heat through surface contact with the heating element. In order to efficiently operate the thermal management system, a temperature sensor is disposed at the rear end of the water block for each part to detect the temperature of discharged water (or other liquid).

The thermal management system may be provided with a valve for switching flow paths of the coolant as needed, and may vary a flow rate of a fluid supplied to each heating part (or heating element), and thus can control the temperature of the heating part so as to be maintained within a target temperature range.

The PMS 31*a* or the BMS 34 may include a controller that controls the thermal management system. The controller (or separate controller) may be a structural device that includes hardware (and may include software). Alternatively, the thermal management system may include a separate controller. Sensing information of a temperature sensor and/or the like may be transmitted to the controller, and the controller can control the operation mode of the thermal management system and operations of the pump, the fan, and the valve (i.e., opening/closing and adjustment of an opening degree).

In an example of conditions for preheating components in the system, heat may be generated by consuming some power through reactive power control of the PCS without using a heat exchanger by controlling an on/off valve (e.g., 1-way valve) provided on the coolant inlet side of the heat exchanger, and the generated waste heat may be recovered to preheat the battery. The preheated battery can operate the ESS system more efficiently since battery chargeable capacity and charging speed are increased. In this manner, according to the ESS thermal management system, the operating range and charging speed of the battery can be improved through cooling in high temperature conditions and preheating in low temperature conditions, thereby expanding the operating range of the system.

In home ESS products, four operation modes can be configured according to operating conditions.

The first operation mode may be a PCS and battery cooling mode. In the PCS and battery cooling mode, heat is generated in the PCS, the battery, and the reactor due to use of an ESS battery. Waste heat generated in each heating element may be recovered and then emitted to the atmosphere through a heat exchanger.

The second operation mode may be a PCS cooling and battery heating mode for cooling the battery with the coolant heated through heating of the PCS in a low outdoor temperature operation and standby state. A heat exchanger may not be used in the PCS cooling and battery heating mode.

The third operation mode may be a battery-only cooling mode for improving battery efficiency by cooling the battery module (or battery) when only the PCS is cooled after completion of normal operation. The battery-only cooling mode may be an operation mode for additionally cooling the battery when only the PCS with a small thermal mass is cooled early at the time of the end of the system operation.

The fourth operation mode may be a PCS-only cooling mode. The PCS-only cooling mode is an operation mode for cooling the PCS mainly when the operation time is short or output is low, and thus there is little heat from the battery but only the PCS generates high heat.

PCS cooling may be described in detail with reference to the drawings.

The energy storage system 1 may include one or more battery packs 10, the casing 12 forming a space in which the one or more battery packs 10 are accommodated, the PCS circuit board 33 that includes (or supports) a plurality of semiconductor devices 33*a* or switching devices, (or the semiconductor devices 410 in FIG. 4) disposed inside the casing 12 and operating to charge or discharge the battery packs 10, and the cooling module 40 disposed inside the casing 12 and including a pump 42 (FIG. 12) for flowing the coolant.

The plurality of semiconductor devices 33*a* (and 410) such as IGBT and SiC may be mounted on the PCS circuit board 33. The semiconductor devices 33*a* (and 410) are heating elements because heat is generated when the semiconductor devices 33*a* (and 410) operate, such as for performing switching. Thus, temperature management may be important because the plurality of semiconductor devices 33*a* (and 410) perform various operations at the PCS circuit board 33.

Figure 4:
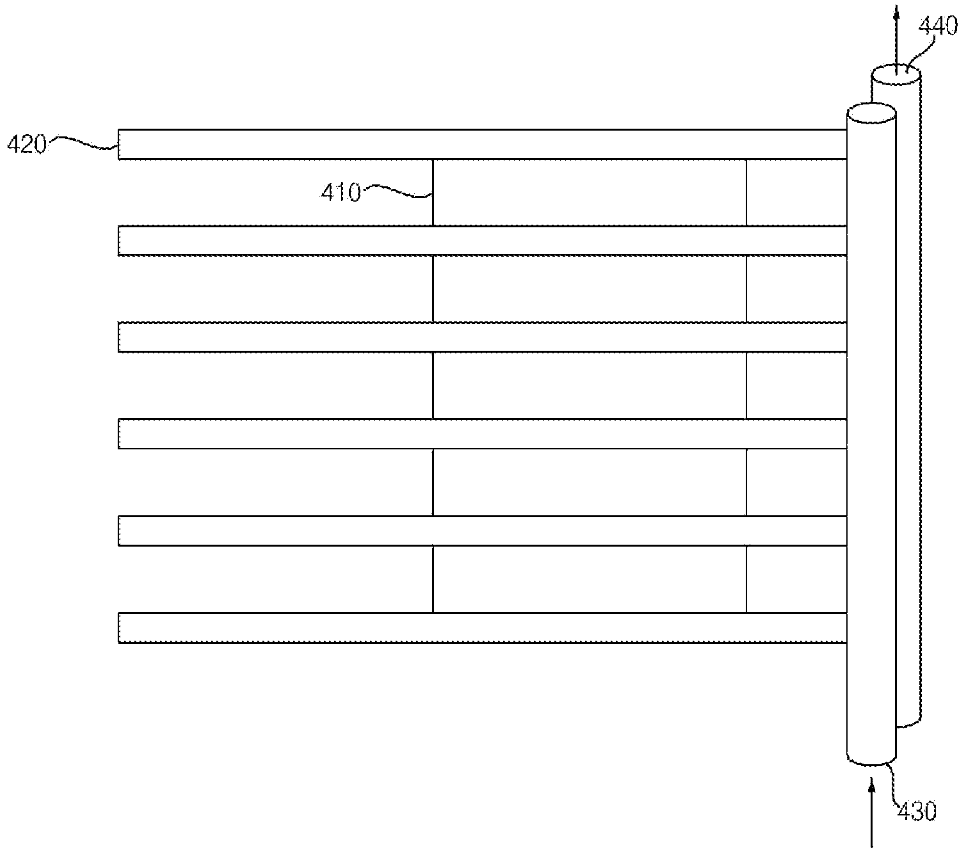
FIGS. 4 and 5 are conceptual views of a semiconductor device cooling structure according to an example embodiment of the present disclosure.
Figure 5:
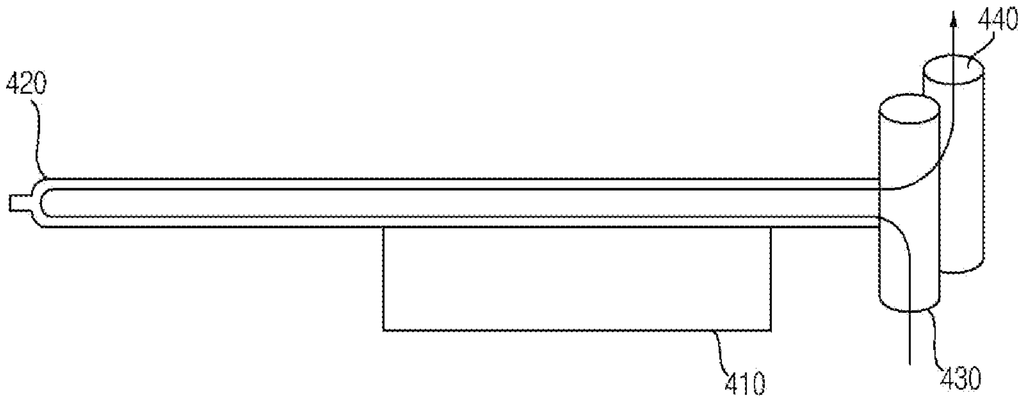

FIGS. 4 and 5 are conceptual views of a semiconductor device cooling structure according to an example embodiment of the present disclosure. The energy storage system 1 may include a plurality of cooling plates 420 (or cooling structures) disposed to come into direct physical contact with the plurality of semiconductor devices 410, a first flow path 430 connected to the plurality of cooling plates 420 and the cooling module 40 through which the coolant discharged from the cooling module 40 flows to the cooling plates 420, and a second flow path 440 connected to the plurality of cooling plates 420 and the cooling module 40 through which the coolant discharged from the plurality of cooling plates 420 flows to the cooling module 40.

The cooling module 40 may include a pump 42 (FIG. 12) for flowing the coolant and a heat exchanger 43 (FIG. 12) for exchanging the coolant flowing by the pump 42 with air. The cooling module 40 may include a heat dissipation fan 44 (FIG. 12) for supplying external air to the heat exchanger 43.

The cooling plates 420 may be PCS-side water blocks and may receive the coolant from the cooling module 40. The plurality of cooling plates 420 may be disposed such that they come into direct physical contact with front and rear surfaces of the plurality of semiconductor devices 410.

According to operation of the pump 42, the coolant flows into the cooling plates 420 through the first flow path 430 and absorbs heat generated by the semiconductor devices 410 in contact with the cooling plates 420. The coolant that has passed by the cooling plates 420 is discharged through the second flow path 440, and the heat of the coolant is exchanged by the heat exchanger 43 such that heat is discharged into the atmosphere.

The controller may operate the pump 42 to circulate the coolant. Heat may be released in such a manner that the coolant circulates between the cooling plates 420 and the cooling module 40, heat generated by the semiconductor devices 410 is absorbed by heat exchange with the coolant, and heat of the coolant is exchanged with air using the heat exchanger 43 and the heat dissipation fan 44.

The cooling module 40 may include a temperature sensor for sensing the temperature of the coolant. The heat dissipation fan 44 may have a rotation speed that is variable in response to the temperature of the coolant. When the temperature of the coolant is high, the heat dissipation fan 44 may be additionally driven or the rotation speed may be increased to improve heat dissipation performance.

Figure 6:
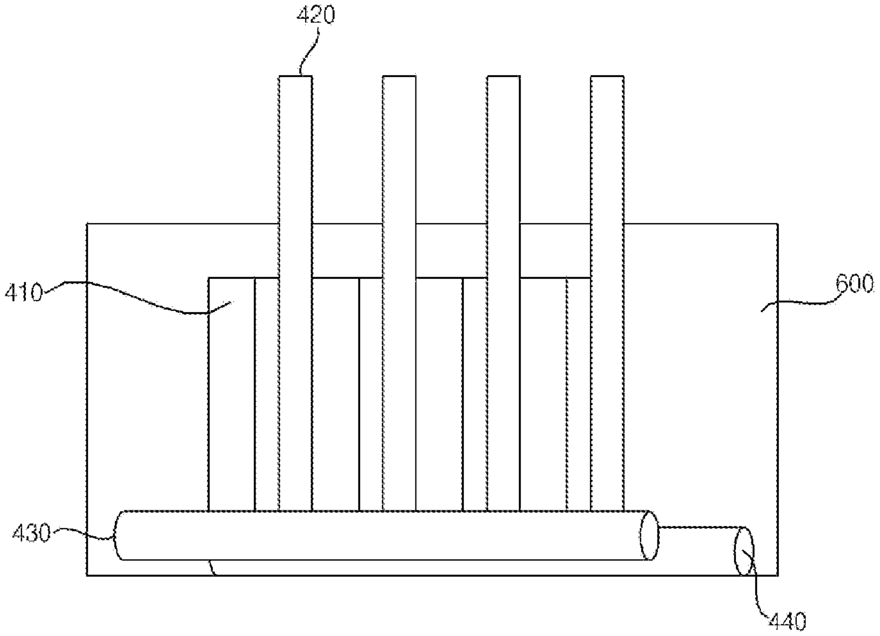
FIG. 6 is a top view of a semiconductor device cooling structure according to an example embodiment of the present disclosure.
Figure 7:
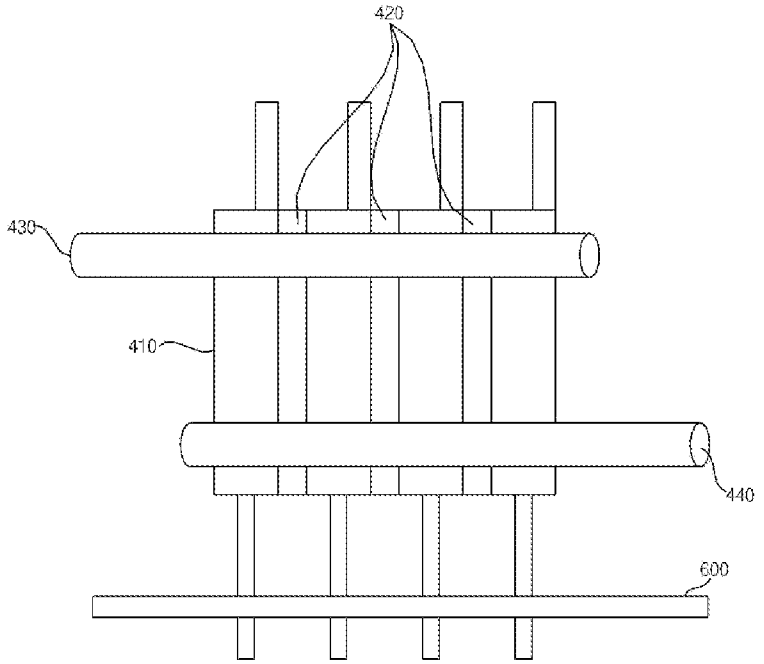
FIG. 7 is a side view of a semiconductor device cooling structure according to an example embodiment of the present disclosure.

FIG. 6 is a top view of a semiconductor device cooling structure according to an example embodiment of the present disclosure. FIG. 7 is a side view of a semiconductor device cooling structure according to an example embodiment of the present disclosure. FIGS. 6 and 7 illustrate a state in which semiconductor devices are mounted on a circuit board (such as a PCB).

Referring to FIGS. 6 and 7, the semiconductor devices 410 are mounted on a PCB 600. The printed circuit board (PCB) 600 (or other circuit board) may be the PCS circuit board 33. Each semiconductor device 410 may include a body and a pin, and may further include a head that protrudes upward from the body. The semiconductor device 410 may be connected to the PCB 600 by the pin. For example, in an example of an IGBT device, three pins of a gate, a collector, and an emitter may be connected to the PCB 600.

The cooling plates 420 may be disposed to come into direct physical contact with the semiconductor devices 410. More particularly, the cooling plates 420 may be disposed to come into direct physical contact with the bodies of the semiconductor devices 410.

The first flow path 430 and the second flow path 440 are disposed on sides of the semiconductor devices 410 such that the coolant may be supplied to the cooling plates 420 and/or the coolant may be discharged from the cooling plates 420.

Each cooling plate 420 may include an internal flow path through which the coolant circulates. The coolant can absorb heat from the semiconductor devices 410 while flowing along the internal flow path. The internal flow path may be formed to have a symmetrical shape, but the internal flow path of the cooling plate 420 may be formed to have an asymmetrical shape.

In the energy storage system according to example embodiments, an area in which the coolant is introduced may be wider than an area in which the coolant is discharged after heat recovery in a contact area where the internal flow paths of the cooling plates come into contact with the semiconductor devices, thereby improving cooling performance.

According to an example embodiment, cooling performance may be improved by forming the internal flow paths of the cooling plates in direct physical contact with the semiconductor devices such that the flow rate of the coolant decreases in the semiconductor device contact area.

The internal flow paths of the plurality of cooling plates 420 may include a first channel connected to the first flow path 430 and a second channel connected to the first channel and the second flow path 440. The internal flow paths may be formed such that an area occupied by the first channel is larger than an area occupied by the second channel in a first area in contact with the semiconductor devices 410. The internal flow paths are formed such that a coolant flow rate in the first channel is lower than a coolant flow rate in the second channel in the first area in contact with the semiconductor devices 410.

More specifically, the first channel may be formed to have a greater width in the first area than in other areas, thereby lowering the coolant flow rate and generating a vortex to improve cooling performance. Alternatively, the first channel may be formed in a zigzag pattern such that the first channel passes through the first area a plurality of times, thereby improving cooling performance of the first area.

Figure 8:
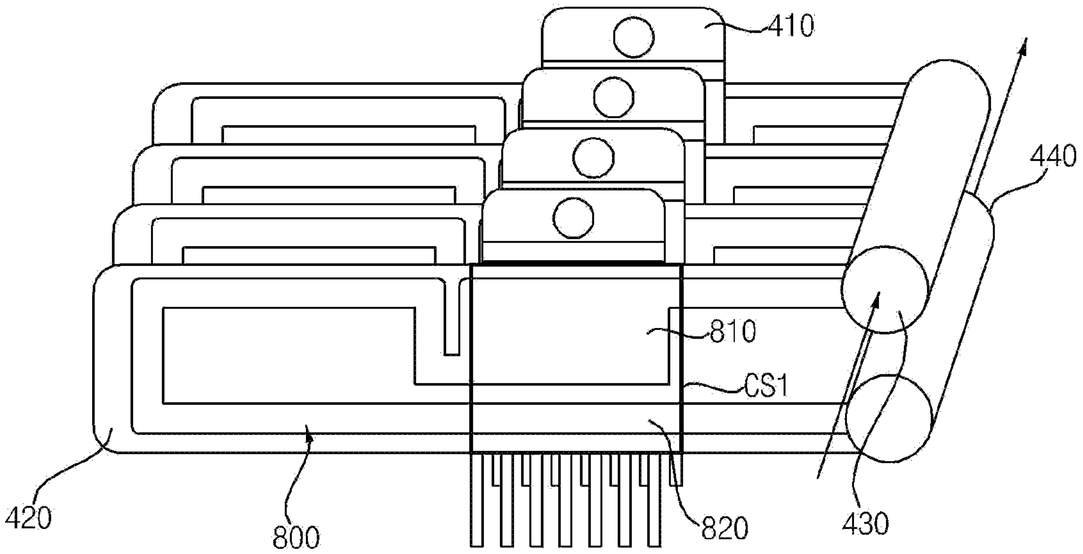
FIG. 8 and FIG. 9 are conceptual views of cooling plates and internal flow paths according to an embodiment of the present disclosure.
Figure 9:
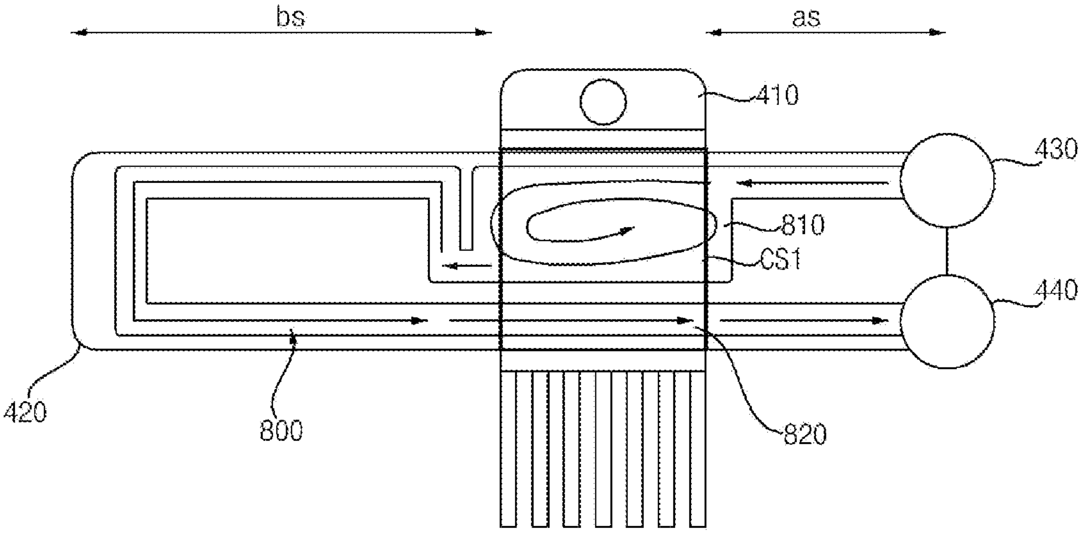

FIGS. 8 and 9 are conceptual views of cooling plates and internal flow paths according to an example embodiment of the present disclosure. Referring to FIGS. 8 and 9, an internal flow path 800 of each cooling plate 420 may include a first channel 810 connected to the first flow path 430 through which the coolant flows. The internal flow path 800 may be connected between the first channel 810 and the second flow path 440, and may include a second channel 820 through which the coolant that has circulated inside the cooling plate 420 is discharged.

The first and second flow paths 430 and 440 may be disposed on one side of each semiconductor device 410. The internal flow path 800 of each cooling plate 420 may have a structure in which the coolant starts from a first end of the cooling plate 420 in which the first flow path 430 is disposed, passes through the area in contact with the semiconductor device 410 and reaches a second r end, and then returns to the first end in which the second flow path 440 is disposed.

According to an example embodiment, the internal flow path may have an asymmetrical shape that maximizes area and time of contact between the semiconductor devices 410 and the coolant (rather than a symmetrical U-turn shape) in order to improve cooling performance.

In the first area CS1 in contact with the semiconductor device 410, the first channel 810 may occupy a larger area than the second channel 820 in the internal flow path 800. Accordingly, the low-temperature coolant flowing into the cooling plate 420 contacts the semiconductor device 410 over a larger area before the temperature thereof increases due to heat recovery, thereby improving heat recovery capability.

The end face of each cooling plate 420 may be formed such that recovered waste heat is partially dissipated. Each cooling plate 420 may be divided into the first area CS1, a second area as between the first area CS1 and the first and second flow paths 430 and 440, and the remaining third area bs. The third area bs may have the largest area among the areas CS1, as, and bs. Accordingly, after the temperature of the coolant, which has increased due to heat recovery in the first area CS1, decreases in the third area bs, the coolant may perform additional heat recovery while passing through the first area CS1 again before being discharged into the second flow path 440.

The flow rate of the coolant flowing through the first channel 810 in the first area CS1 may be less than the flow rate of the coolant flowing through the first channel 810 in the other areas as and bs. Further, in the first area CS1, the flow rate of the coolant flowing through the first channel 810 may be less than the flow rate of the coolant flowing through the second channel 820. Accordingly, the low-temperature coolant flowing to the cooling plate 420 contacts the semiconductor device 410 for a long time, thereby improving heat recovery capability.

The first channel 810 may have a larger width at the first area CS1 than in other areas as and bs, thereby lowering the coolant flow rate and generating a vortex to improve cooling performance.

Figure 10:
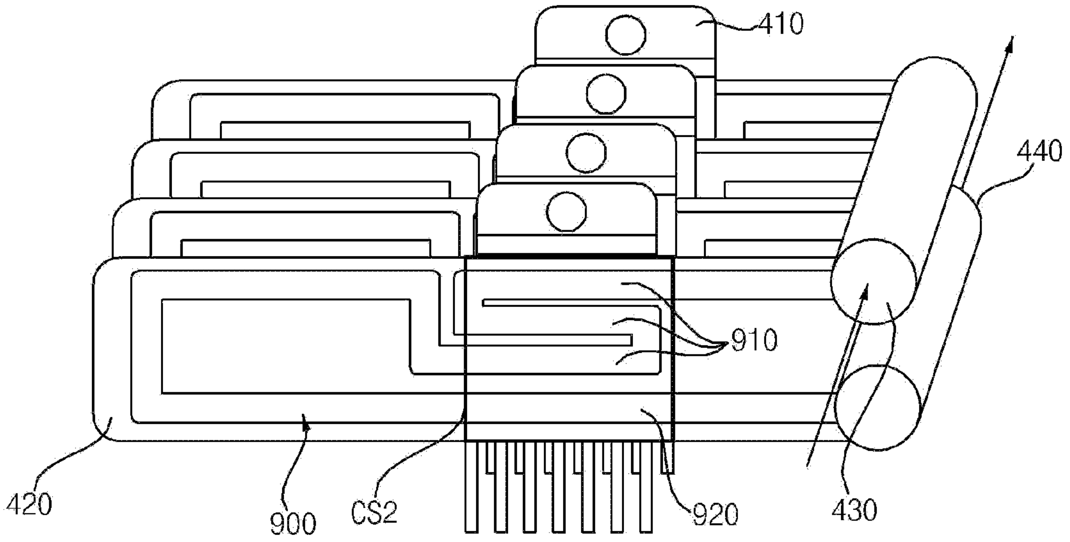
FIGS. 10 and 11 are conceptual views of cooling plates and internal flow paths according to an embodiment of the present disclosure.
Figure 11:
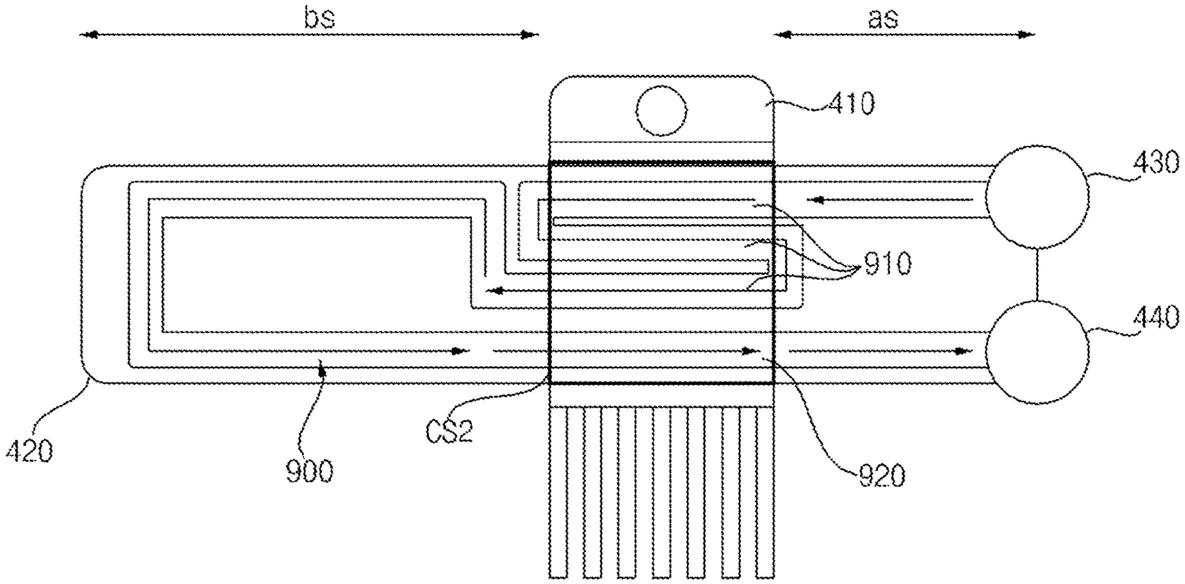

FIGS. 10 and 11 are conceptual views of cooling plates and internal flow paths according to an example embodiment of the present disclosure. Referring to FIGS. 10 and 11, an internal flow path 900 of each cooling plate 420 includes a first channel 910 connected to the first flow path 430 into which the coolant flows. The internal flow path 910 is connected between the first channel 910 and the second flow path 440, and includes a second channel 920 through which the coolant that has circulated inside the cooling plate 420 is discharged.

The first and second flow paths 430 and 440 may be disposed on one side of each semiconductor device 410. The internal flow path 900 of each cooling plate 420 may have a structure in which the coolant starts from one end of the cooling plate 420 in which the first flow path 430 is disposed, passes through an area CS2 in contact with the semiconductor device 410 and reaches the other end, and then returns to one end in which the second flow path 440 is disposed.

In the internal flow path 900, the first channel 910 may occupy a larger area than the second channel 920 in (or at the first area CS2 in contact with the semiconductor device 410. The first channel 910 may have a zigzag pattern such that the first channel 910 passes through the first area CS2 a plurality of times.

The flow rate of the coolant flowing at the first area CS2 while reciprocating the first channel 910 in a zigzag pattern is lower than the flow rate of the coolant flowing through the first channel 910 at other areas as and bs. The flow rate of the coolant flowing through the first channel 910 may be lower than the flow rate of the coolant flowing through the second channel 920. Accordingly, the low-temperature coolant flowing to the cooling plate 420 contacts the semiconductor device 410 for a long time, thereby improving heat recovery capability.

The end face of each cooling plate 420 may be formed such that recovered waste heat is partially dissipated. The cooling plate 420 may be divided into the first area CS2, a second area as between the first area CS2 and the first and second flow paths 430 and 440, and the remaining third area bs. The third area bs may have the largest area among the areas CS2, as, and bs. Accordingly, after the temperature of the coolant, which has increased due to heat recovery at the first area CS2, decreases in the third area bs, the coolant may perform additional heat recovery while passing through the first area CS2 again before being discharged into the second flow path 440.

According to embodiments of the present disclosure, by directly contacting the cooling plates 420 through which the coolant flows to the semiconductor devices 410 that are heating elements, the amount of waste heat recovery can be increased and cooling performance can be improved. By preventing overheating of the semiconductor devices 410 and managing the temperature at an appropriate level, switching efficiency can also be improved.

Figure 12:
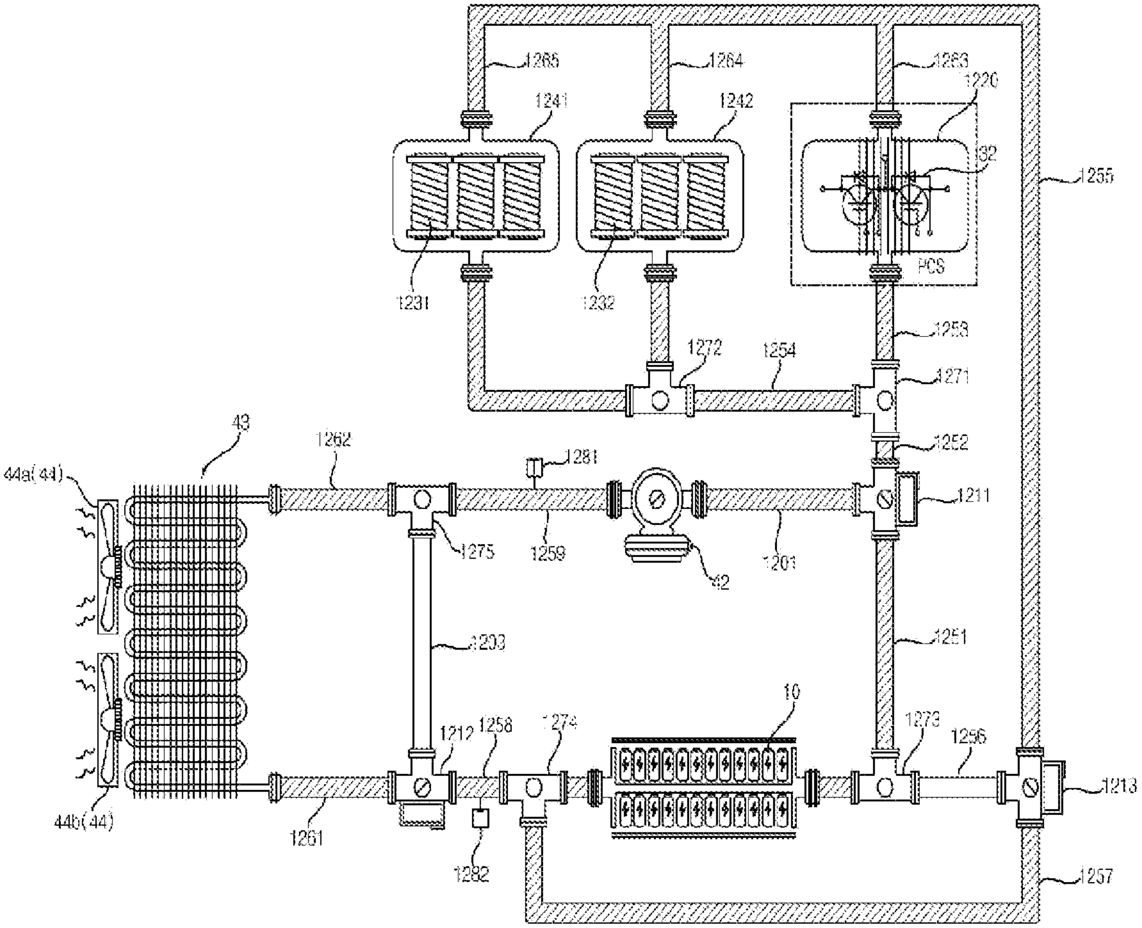
FIG. 12 is a diagram referenced in a description of a cooling mode of an energy storage system according to an example embodiment of the present disclosure.

FIG. 12 is a view referenced in a description of a cooling mode of the energy storage system according to an example embodiment of the present disclosure. Other embodiments and configurations may also be provided. Referring to FIG. 12, the thermal management system of the energy storage system 1 may include the pump 42 for flowing a coolant, the heat exchanger 43 for exchanging the heat of the coolant flowing by the pump 42 with air, and the heat dissipation fan 44 for supplying external air to the heat exchanger 43. According to an example embodiment, the heat dissipation fan 44 may include a first heat dissipation fan 44*a* and a second heat dissipation fan 44*b*.

When the pump 42 operates, the coolant may be supplied through a first coolant circulation path 1201 and distributed to second coolant circulation paths 1252 and 1253 and a third coolant circulation path 1251 branched from the first coolant circulation path 1201.

The second coolant circulation paths 1252 and 1253 are paths for supplying the coolant to the PCS 32, and are connected to the above-described first flow path 430. A water block 1220 on the side of the PCS 32 may correspond to the above-described cooling plate 420, and the coolant discharged from the pump 42 may be supplied to the cooling plate 420 through the first coolant circulation path 1201, the second coolant circulation paths 1252 and 1253, and the first flow path 430.

As described with respect to FIGS. 4 to 11, the plurality of cooling plates 420 may contact the semiconductor devices 33*a* and 410 such as IGBTs and SiC devices mounted on the circuit board 33 (600) of the PCS 32. Accordingly, waste heat of the semiconductor devices 33*a* and 410 generating heat during the charging/discharging operation of the battery pack 10 may be efficiently recovered, and switching efficiency may be improved by reducing the temperature.

The coolant discharged from the plurality of cooling plates 420 may flow to a PCS flow path 1263 connected to the second flow path 440.

The third coolant circulation path 1251 may be a path for supplying the coolant to the battery pack 10. More specifically, the coolant may be supplied to the battery cooling plate 50 which is a water block on the side of the battery.

The energy storage system 1 may include one or more reactors 1231 and 1232 for voltage/current stabilization. For example, the energy storage system 1 may include a first reactor 1231 for stabilizing a sudden change in current applied from an AC power source, and a second reactor 1232 for stabilizing a sudden change in current applied from the battery pack 10.

The energy storage system 1 may include reactor water blocks 1241 and 1242 for cooling the reactors 1231 and 1232. The reactor water blocks 1241 and 1242 may contact the reactors 1231 and 1232 to cool the reactors 1231 and 1232 using the coolant from the cooling module 40. The coolant of the reactor water blocks 1241 and 1242 may be discharged to reactor flow paths 1265 and 1264.

A T-type connector 1271 may be disposed in (or at) the second coolant circulation paths 1252 and 1253 to distribute the coolant to the second coolant circulation path 1253 and a flow path 1254 on the side of the reactor water blocks 1241 and 1242.

When the energy storage system 1 includes the first reactor 1231 and the second reactor 1232, the energy storage system 1 may include a T-type connector 1272 for evenly distributing the coolant back to the first reactor 1231 and the second reactor 1232.

The PCS flow path 1263 and the reactor flow paths 1265 and 1264 may be combined into a fourth coolant circulation path 1255. Accordingly, the coolant discharged from the cooling plate 420 through the second flow path 440 may flow to the fourth coolant circulation path 1255 through the PCS flow path 1263.

The fourth coolant circulation path 1255 may be branched into a fifth coolant circulation path 1256 and a bypass flow path 1257. The fifth coolant circulation path 1256 may be a path for supplying the coolant to the battery pack 10. The bypass flow path 1257 may be a path for flowing the coolant without passing through the battery pack 10.

A T-type connector 1273 may be disposed at a point where the third coolant circulation path 1251 and the fifth coolant circulation path 1256 meet.

A first three-way valve 1211 is disposed in (or at) the first coolant circulation path 1201. The first three-way valve 1211 is disposed at a point where the first to third coolant circulation paths 1201, 1253, and 1251 meet, and may distribute the coolant in the first coolant circulation path 1201 to the second coolant circulation path 1253 and the third coolant circulation path 1251.

A second three-way valve 1213 may be disposed in (or at) the fourth coolant circulation path 1255. The second three-way valve 1213 may be disposed at a point where the fourth coolant circulation path 1255, the fifth coolant circulation path 1256, and the bypass flow path 1257 meet, and may operate such that the coolant in the fourth coolant circulation path 1255 is selectively supplied to the fifth coolant circulation path 1256 or the bypass flow path 1257.

A third three-way valve 1212 may be disposed at a point where the outlet side flow path of the battery pack 10, more specifically, the battery cooling plate 50 and the bypass flow path 1257 meet. The third three-way valve 1212 may operate such that the coolant discharged from the outlet of the battery cooling plate 50 and the bypass flow path 1257 is selectively supplied to the heat exchanger 43 or the pump 42.

A T-type connector 1274 may be disposed at a point where the outlet side flow path of the battery pack 10, more specifically, the battery cooling plate 50 and the bypass flow path 1257 meet, and may be connected to a sixth coolant circulation path 1258. The sixth coolant circulation path 1258 may be connected to the third three-way valve 1212. The third three-way valve 1212 may be connected to a seventh coolant circulation path 1203.

A first heat exchanger flow path 1261 may be connected to an inlet of the heat exchanger 43, and a second heat exchanger flow path 1262 may be connected to an outlet of the heat exchanger 43. The coolant flows into the heat exchanger 43 through the first heat exchanger flow path 1261 and is discharged from the heat exchanger 43 through the second heat exchanger flow path 1262.

The third three-way valve 1212 may supply the coolant introduced through the sixth coolant circulation path 1258 to the seventh coolant circulation path 1203 or the first heat exchanger flow path 1261.

The second heat exchanger flow path 1262 and the seventh coolant circulation path 1203 may be combined into an eighth coolant circulation path 1259. A T-type connector 1275 may be disposed at a point where the second heat exchanger flow path 1262, the seventh coolant circulation path 1203, and the eighth coolant circulation path 1259 meet. The eighth coolant circulation path 1259 may be connected to the pump 42.

The controller may control the thermal management system based on the coolant temperature sensed by temperature sensors 1281 and 1282. For example, a first temperature sensor 1281 may be disposed in (or at) the eighth coolant circulation path 1259 and a second temperature sensor 1282 may be disposed in (or at) the sixth coolant circulation path 1258 to sense the coolant temperature.

If the energy storage system 1 is operating normally while the coolant temperature sensed by the temperature sensors 1281 and 1282 is equal to or higher than a predetermined temperature, the controller may control the thermal management system to be in the cooling mode.

Referring to FIG. 12, the pump 42 may operate and the coolant may be supplied to the first coolant circulation path 1201. In the cooling mode, the first three-way valve 1211 may distribute the coolant supplied from the pump 42 to the second coolant circulation paths 1252 and 1253 and the third coolant circulation path 1251. That is, the first three-way valve 1211 may operate such that the coolant is supplied to both the PCS 32 and the battery pack 10. The cooling mode shown with respect to FIG. 12 may be the PCS and battery cooling mode.

In the example of the PCS-only cooling mode, the first three-way valve 1211 may operate such that the coolant supplied from the pump 42 is supplied only to the second coolant circulation paths 1252 and 1253.

The second three-way valve 1213 may operate such that the coolant in the fourth coolant circulation path 1255 is supplied to the bypass flow path 1257. The third three-way valve 1212 may operate such that the coolant from the battery pack 10 and the bypass flow path 1257 is supplied to the heat exchanger 43.

Accordingly, the coolant supplied through the pump 42 is distributed and supplied to the battery pack 10 and the PCS 32 and the reactors 1231 and 1232 through the first three-way valve 1211, the coolant that has recovered waste heat is supplied to the heat exchanger 43, and the heat dissipation fan 44 changes the fan rotation speed in response to the coolant temperature and discharges waste heat, thereby reducing the temperature of the coolant.

Figure 13:
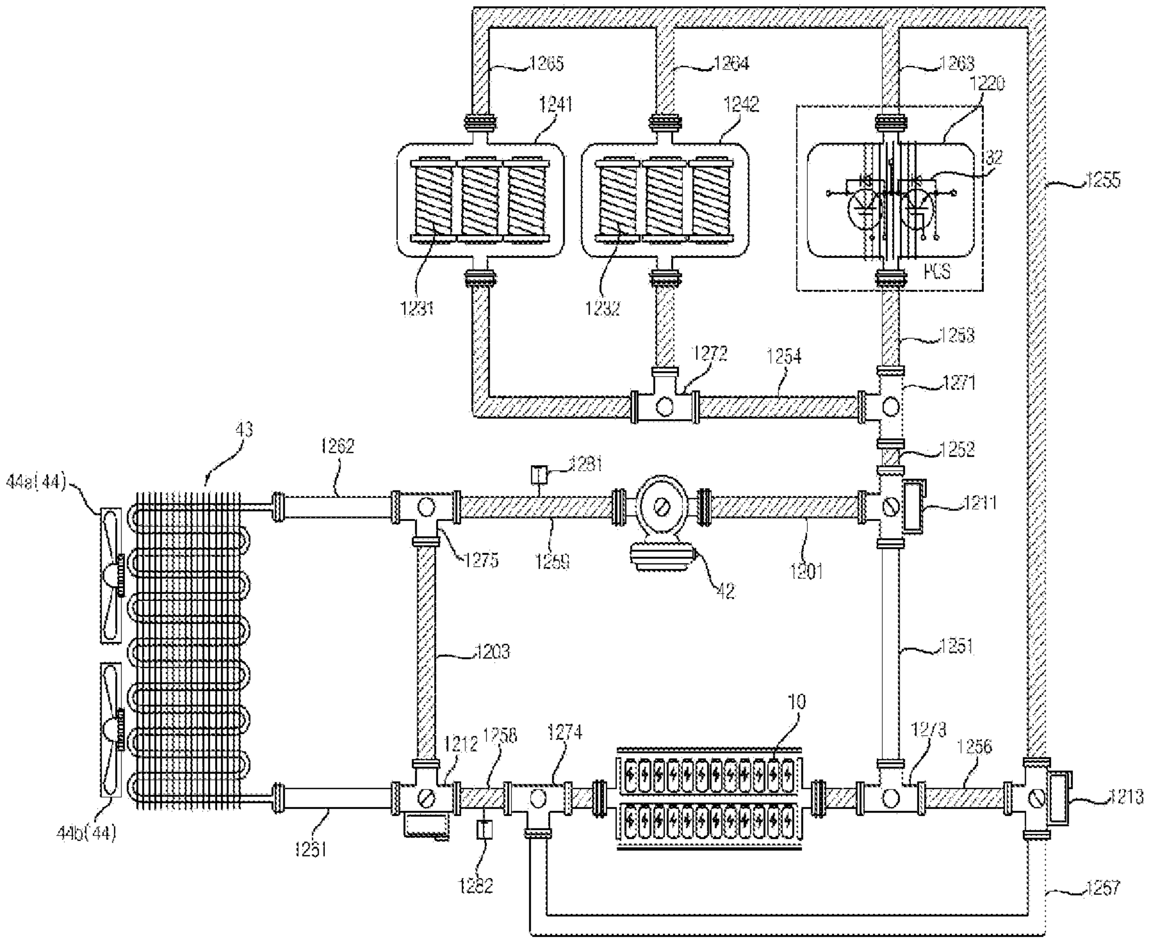
FIG. 13 is a diagram referenced in a description of a preheating mode of an energy storage system according to an example embodiment of the present disclosure.

FIG. 13 is a view referenced in a description of a preheating mode of the energy storage system according to an example embodiment of the present disclosure. Other embodiments and configurations may also be provided.

When the coolant temperature is equal to or less than a certain temperature, normal operation of the battery pack 10 is impossible, and thus the operation mode is controlled to be a mode for preheating the battery pack 10.

Referring to FIG. 13, in the preheating mode, the pump 42 operates and the first three-way valve 1211 may operate such that the coolant supplied to the first coolant circulation path 1201 is supplied to the second coolant circulation paths 1252 and 1253. That is, all of the coolant supplied through the pump 42 is supplied to the PCS 32 and the reactors 1231 and 1232 through the first three-way valve 1211.

The second three-way valve 1213 may operate such that the coolant in the fourth coolant circulation path 1255 is supplied to the battery pack 10, and the third three-way valve 1212 may operate such that the coolant from the battery pack 10 is supplied to the pump 42.

The third three-way valve 1212 may be controlled to be switched such that the heat exchanger 43 is not used. The PCS 32 and the reactors 1231 and 1232 may generate heat through reactive power control in the preheating mode, and the low-temperature coolant supplied to the PCS 32 and the reactors 1231 and 1232 is heated. The heated coolant is supplied to the inlet side of the battery pack 10 by switching control of the second three-way valve 1213 as medium-temperature coolant, and the medium-temperature coolant may be discharged at a low temperature after preheating the battery pack 10. The preheating operation may be continued such that the battery pack 10 is preheated to a predetermined temperature or higher, and after the battery pack 10 is preheated, the energy storage system 1 may enter a normal operation. After the normal operation is started, the coolant is heated by the battery pack 10 and the PCS 32 and the reactors 1231 and 1232, and thus the thermal management system enters the cooling mode operation.

Figure 14:
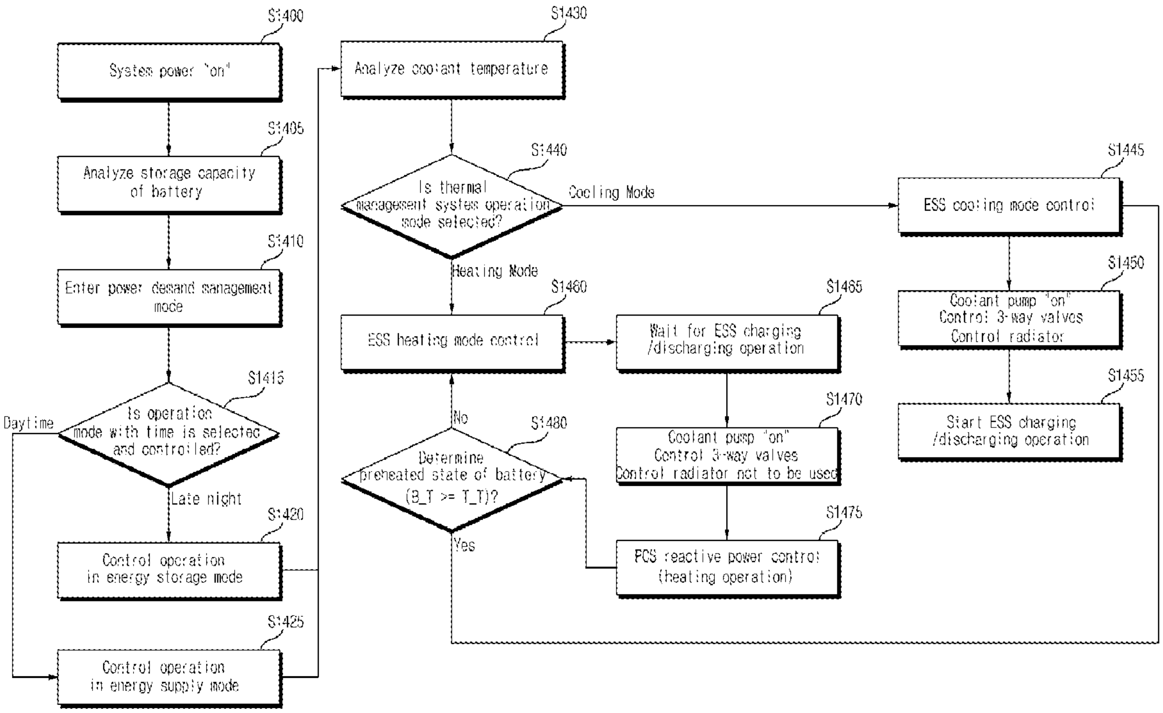
FIG. 14 is a flowchart of a method of operating an energy storage system according to an example embodiment of the present disclosure.

FIG. 14 is a flowchart of a method of operating the energy storage system according to an example embodiment of the present disclosure. Other embodiments, configurations and operations may also be provided. Referring to FIG. 14, in a state in which the energy storage system 1 is powered on (S1400), the controller may check operating conditions (S1405 to S1425) and analyze a coolant temperature detected by the temperature sensors 1281 and 1282 (S1430).

Various logics and conditions may be applied as operating conditions of the energy storage system 1 by the manufacturer and/or the user. For example, the controller may analyze the storage capacity of the battery 35 (S1405) and enter a power demand management mode based on the storage capacity of the battery 35 and a load (S1410). The power demand management mode may correspond to the above-described charge/discharge mode based on a rate plan, and may be selectively controlled as an operation mode with time (S1415). In the late-night time zone when electricity rates are low, operation may be controlled in an energy storage mode in which the battery 35 is charged with the power supplied from the grid 9 (S1420). During the daytime when electricity rates are high and the load is high, the operation may be controlled in an energy supply mode in which the battery 35 is discharged (S1425).

The controller may select a thermal management system operation mode based on the coolant temperature (S1440). When cooling is required, the controller may control the thermal management system in the cooling mode (S1445). As shown in FIG. 12, the pump can be turned on and the three-way valves 1211, 1212, and 1213 can be controlled. Additionally, as shown in FIG. 12, a radiator including the heat exchanger 43 and the heat dissipation fan 44 may be controlled (S1450).

In a state in which the thermal management system operates in the cooling mode, the energy storage system 1 may perform a normal charging or a discharging operation (S1455).

The thermal management system may operate in a heating mode for preheating the battery 35 (S1460). In this example, the energy storage system 1 may wait by delaying or stopping the start of charging or discharging (S1465).

In the heating mode, as shown in FIG. 12, the pump may be turned on and the three-way valves 1211, 1212, and 1213 can be controlled. Additionally, as shown in FIG. 12, the radiator including the heat exchanger 43 and the heat dissipation fan 44 can be controlled (S1470). In a state in which the thermal management system operates in the heating mode, the PCS 32 and the reactors 1231 and 1232 can generate heat through reactive power control in the example of the preheating mode operation, the coolant can circulate, and the battery 35 can be preheated (S1475).

On the other hand, when the battery 35 is preheated and thus the battery temperature B_T is equal to or higher than a preheating reference temperature T_T (S1480), the energy storage system 1 may start or resume battery charging/discharging to perform normal operation, and the thermal management system may be controlled to enter the cooling mode (S1445).

If the battery 35 is not sufficiently preheated and thus the battery temperature B_T is less than the preheating reference temperature (S1480), the operation mode in which the battery pack 10 is preheated is continued (S1460).

Another embodiment of the present disclosure may be described with reference to FIGS. 15 to 24. Differences from embodiments described with reference to FIGS. 4 to 14 may be mainly described, and unless otherwise described, technical features of the above-described embodiment may also be applied to the embodiments shown in FIGS. 15 to 24.

Figure 15:
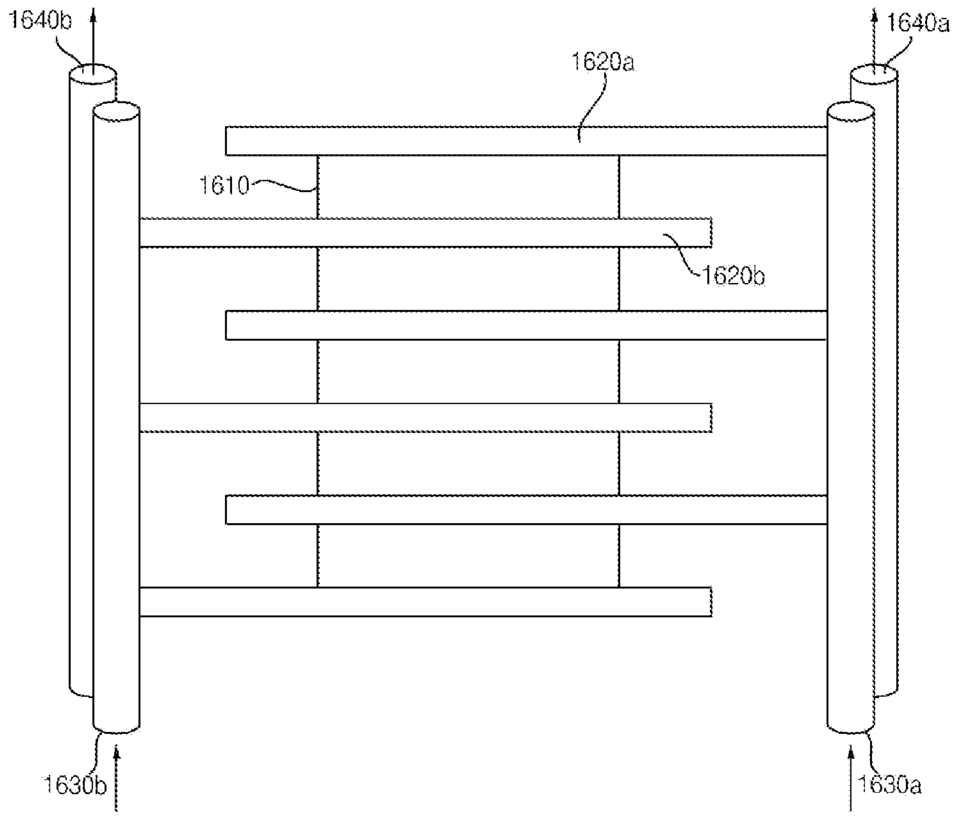
FIGS. 15 and 16 are conceptual views of a semiconductor device cooling structure according to an example embodiment of the present disclosure.
Figure 16:
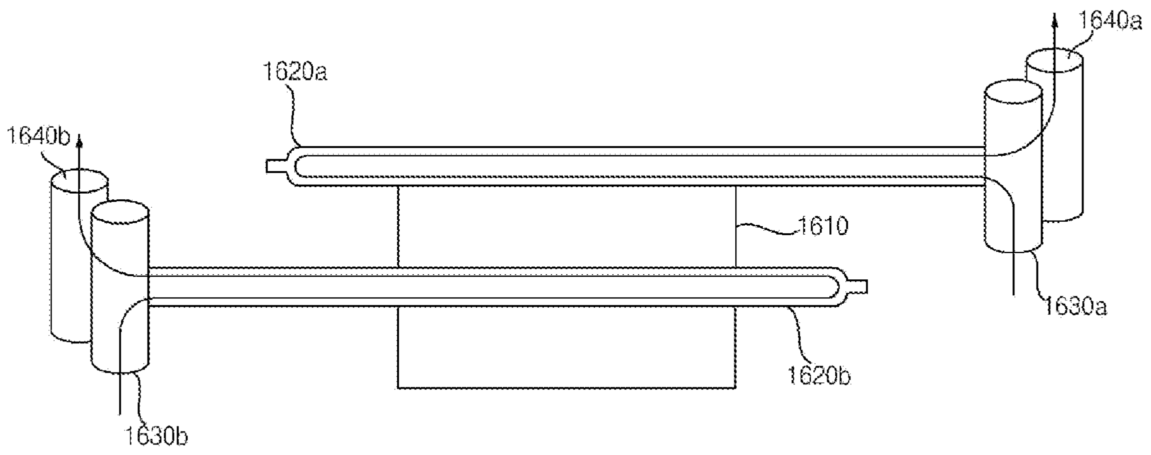

FIGS. 15 and 16 are conceptual views of a semiconductor device cooling structure according to an example embodiment of the present disclosure. Referring to FIGS. 15 and 16, a plurality of cooling plates may include first cooling plates 1620*a* in direct physical contact with front surfaces of a plurality of semiconductor devices 1610 and second cooling plates 1620*b* in direct physical contact with rear surfaces of the semiconductor devices 1610. The cooling plates 1620*a* and 1620*b* may be PCS-side water blocks, and may receive the coolant from the cooling module 40.

With respect to the semiconductor devices 1610, first and second flow paths 1630*a* and 1640*a* connected to the first cooling plates 1620*a* may be disposed on the opposite side of the first and second flow paths 1630*a* and 1640*a* connected to the second cooling plates 1620*b*.

Although the cooling plates 420 described with respect to FIGS. 3 and 4 may also contact the front/rear surfaces of the semiconductor devices, the present embodiment may differ from the above-described embodiment in that the coolant flows into/from the cooling plates 420 in the same first and second flow paths 430*a* and 440*a* disposed on one side.

Referring to FIGS. 15 and 16, according to operation of the pump 42, the coolant flows to the first and second cooling plates 1620*a* and 1620*b* through the first flow paths 1630*a* and 1630*b* and absorbs heat generated by the semiconductor devices 1610 in contact with the first and second cooling plates 1620*a* and 1620*b*. The coolant that has passed by the first and second cooling plates 1620*a* and 1620*b* may be discharged through the second flow paths 1640*a* and 1640*b*, and the heat of the coolant may be exchanged in the heat exchanger 43 and discharged to the atmosphere.

The controller may operate the pump 42 to circulate the coolant. Heat may be released such that the coolant circulates between the first and second cooling plates 1620*a* and 1620*b* and the cooling module 40, heat generated from the semiconductor devices 1610 may be absorbed through heat exchange with the coolant, and the coolant may exchange heat with air using the heat exchanger 43 and the heat dissipation fan 44.

Figure 17:
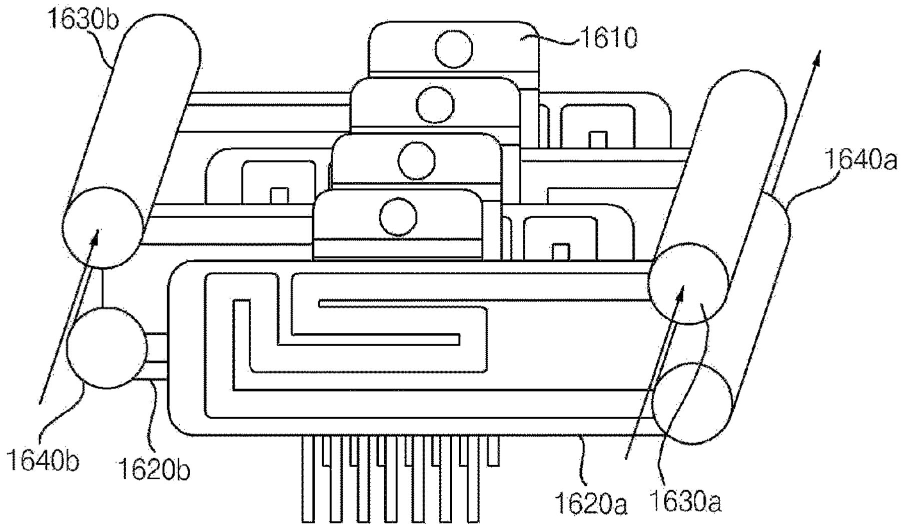
FIGS. 17, 18A, and 18B are conceptual views of cooling plates and internal flow paths according to an example embodiment of the present disclosure.
Figure 18A:
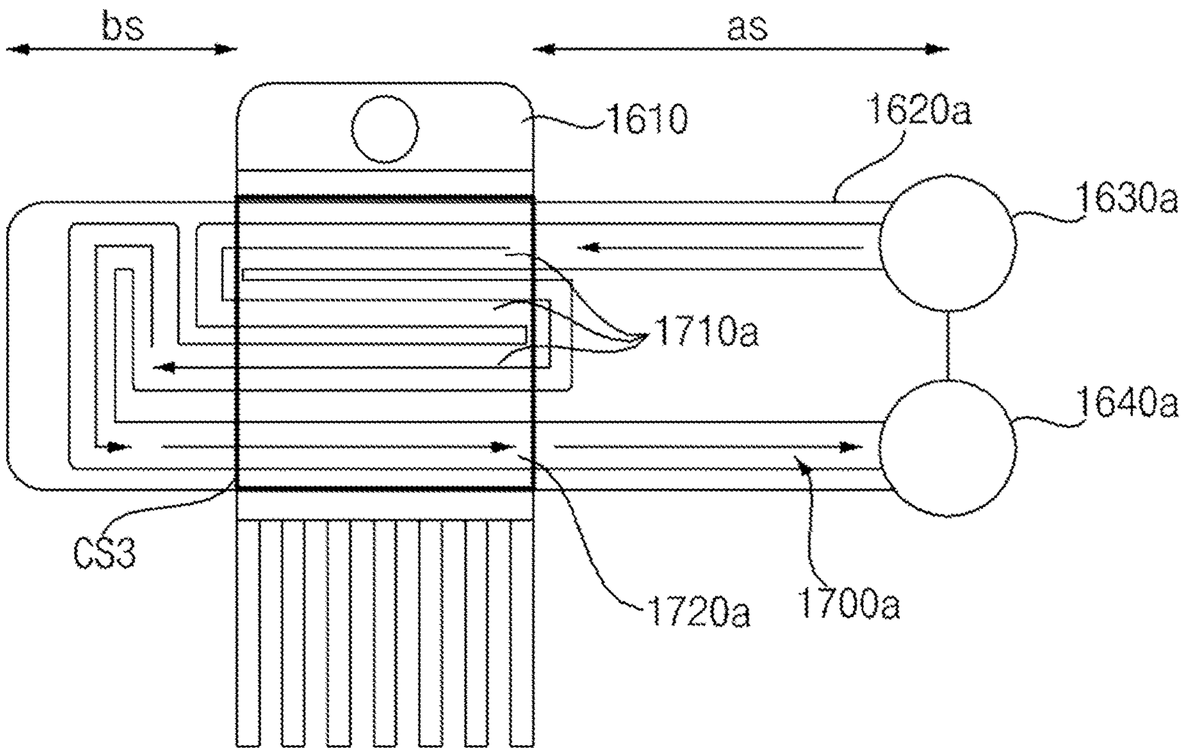
Figure 18B:
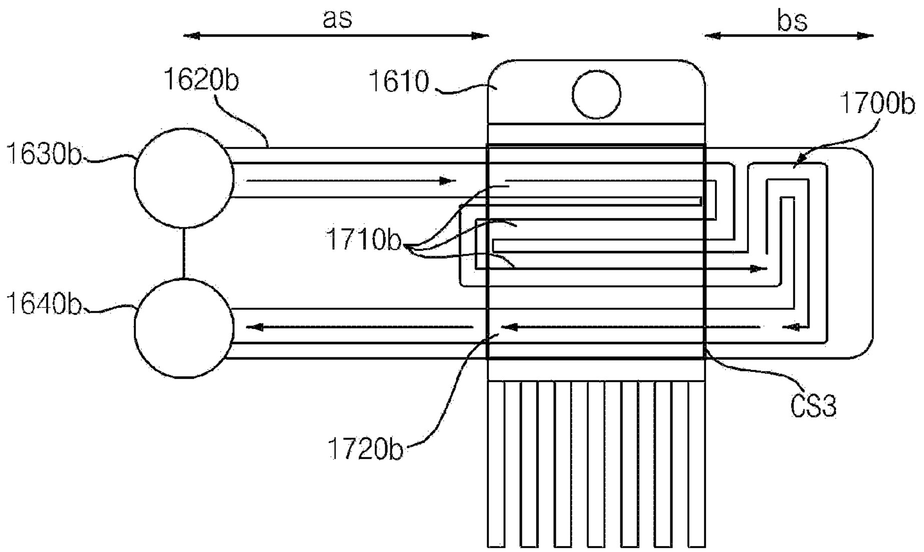

FIGS. 17, 18A, and 18B are conceptual views of cooling plates and internal flow paths according to an example embodiment of the present disclosure. FIG. 17 shows the plurality of semiconductor devices 1610 and the plurality of first and second cooling plates 1620*a* and 1620*b*. FIG. 18A shows one semiconductor device 1610 and the first cooling plate 1620*a* disposed on the front surface of the semiconductor device 1610, and FIG. 18B shows one semiconductor device 1610 and the second cooling plate 1620*b* disposed on the rear surface of the semiconductor device 1610.

Referring to FIGS. 17, 18A, and 18B, internal flow paths 1700*a* and 1700*b* of the first and second cooling plates 1620*a* and 1620*b* include first channels 1710*a* and 1710*b* connected to the first flow paths 1630*a* and 1630*b*, into which the coolant flows. The internal flow paths 1700*a* and 1700*b* may include second channels 1720*a* and 1720*b* connected between the first channels 1710*a* and 1710*b* and the second flow paths 1640*a* and 1640*b*, through which the coolant that has circulated inside the first and second cooling plates 1620*a* and 1620*b* is discharged.

The first flow paths 1630*a* and 1630*b* and the second flow paths 1640*a* and 1640*b* may be disposed on both sides of the semiconductor device 1610. In the internal flow paths 1700*a* and 1700*b* of the first and second cooling plates 1620*a* and 1620*b*, the first channels 1710*a* and 1710*b* occupy a larger area than the second channels 1720*a* and 1720*b* in a first area CS3 in direct physical contact with the semiconductor device 1610. Further, the first channels 1710*a* and 1710*b* may be formed in a zigzag pattern such that the channels pass through the first area CS3 a plurality of times.

The flow rate of the coolant flowing by the first area CS3 while reciprocating the first channels 1710*a* and 1710*b* formed in a zigzag pattern may be lower than the flow rate of the coolant flowing through the first channels 1710*a* and 1710*b* in other areas as and bs. Further, the flow rate of the coolant flowing through the first channels 1710*a* and 1710*b* may be lower than the flow rate of the coolant flowing through the second channels 1720*a* and 1720*b*.

The end faces of the first and second cooling plates 1620*a* and 1620*b* may be formed such that recovered waste heat is partially dissipated. The first and second cooling plates 1620*a* and 1620*b* may be divided into the first area CS3, a second area as between the first area CS3 and the first and second flow paths 1630*a*, 1630*b*, 1640*a*, and 1640*b*, and the remaining third area bs.

The third area bs may have the smallest area among the areas CS3, as, and bs. Accordingly, the first and second flow paths 1630*a*, 1630*b*, 1640*a*, and 1640*b* can be located close to the first area CS3 without interfering with other plates.

In the example embodiment, dual cooling plates 1620*a* and 1620*b* are configured, the first cooling plate 1620*a* is disposed on the front side of the heating element (the semiconductor device) 1610 and the first cooling plate 1620*b* is disposed on the rear side thereof. The double cooling plates 1620*a* and 1620*b* shown in FIGS. 17, 18A, and 18B may have the same flow path structure as the single cooling plate shown in FIGS. 10 and 11, but may have a shorter plate length.

Figure 19:
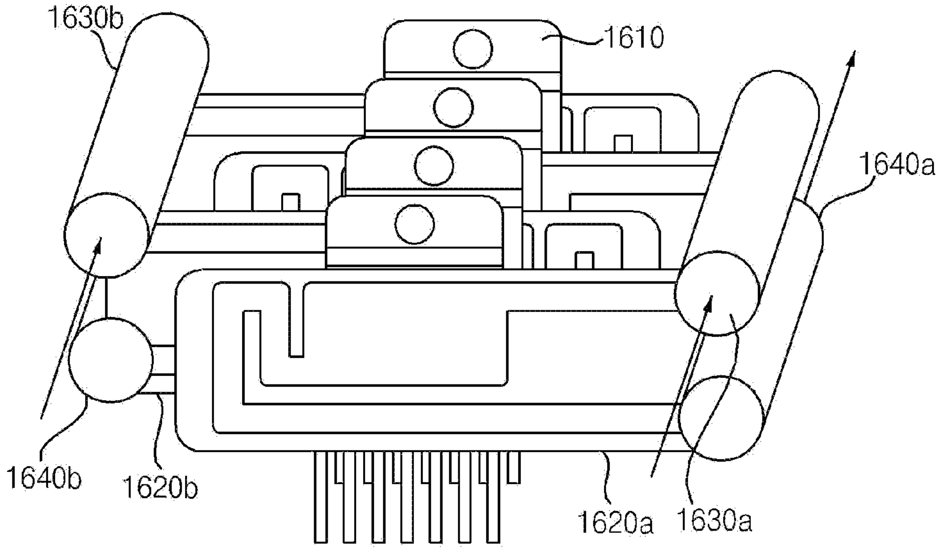
FIGS. 19, 20A, and 20B are conceptual views of cooling plates and internal flow paths according to an example embodiment of the present disclosure.
Figure 20A:
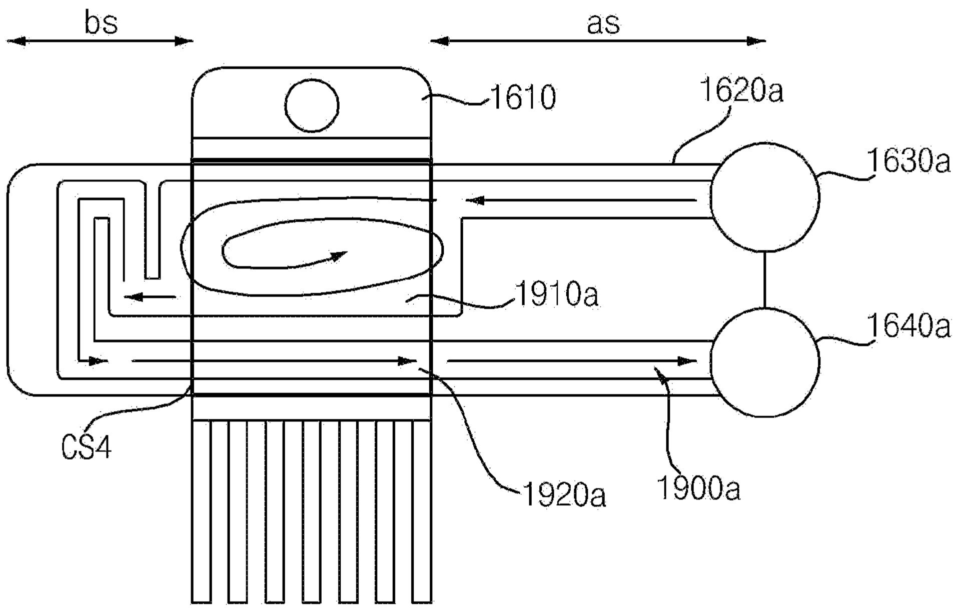
Figure 20B:
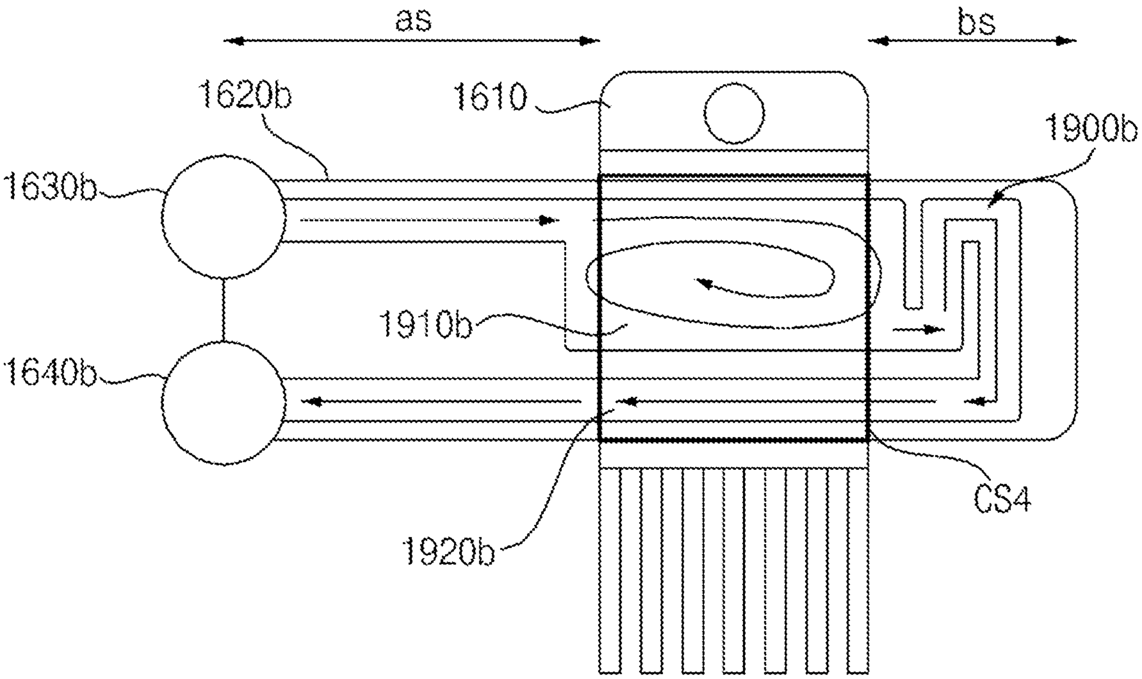

FIGS. 19, 20A, and 20B are conceptual views of cooling plates and internal flow paths according to an example embodiment of the present disclosure and illustrate internal flow paths different from those illustrated in FIGS. 17, 18A, and 18B.

Referring to FIGS. 19, 20A, and 20B, the internal flow paths 1900*a* and 1900*b* of the first and second cooling plates 1620*a* and 1620*b* may include first channels 1910*a* and 1910*b* connected to the first flow channels 1630*a* and 1630*b*, into which the coolant flows. The internal flow paths 1900*a* and 1900*b* may include second channels 1920*a* and 1920*b* connected between the first channels 1910*a* and 1910*b* and the second flow paths 1640*a* and 1640*b*, through which the coolant that has circulated inside the first and second cooling plates 1620*a* and 1620*b* is discharged.

The first flow paths 1630*a* and 1630*b* and the second flow paths 1640*a* and 1640*b* may be disposed on both sides of the semiconductor device 1610. The internal flow paths 1900*a* and 1900*b* of the first and second cooling plates 1620*a* and 1620*b* may have a structure in which the coolant starts from one end of the first and second cooling plates 1620*a* and 1620*b* in which the first flow paths 1630*a* and 1630*b* are disposed, passes through an area in contact with the semiconductor device 1610 and reaches the other end, and then returns to one end at which the second flow paths 1640*a* and 1640*b* are disposed.

In the internal flow paths 1900*a* and 1900*b*, the first channels 1910*a* and 1910*b* may occupy a larger area than the second channels 1920*a* and 1920*b* in the first area CS4 in direct physical contact with the semiconductor device 1610. Accordingly, the low-temperature coolant flowing into the first and second cooling plates 1620*a* and 1620*b* contacts the semiconductor device 1610 over a larger area before the temperature of the coolant increases due to heat recovery, thereby improving heat recovery capability.

The first channels 1910*a* and 1910*b* may be wider at the first area CS4 than at the other areas as and bs, thereby lowering the coolant flow rate and generating a vortex to improve cooling performance.

According to the present disclosure, coolant can more efficiently recover waste heat from the heating element of the PCS by applying the cooling plates, thereby increasing the operation efficiency of the PCS.

Figure 21:
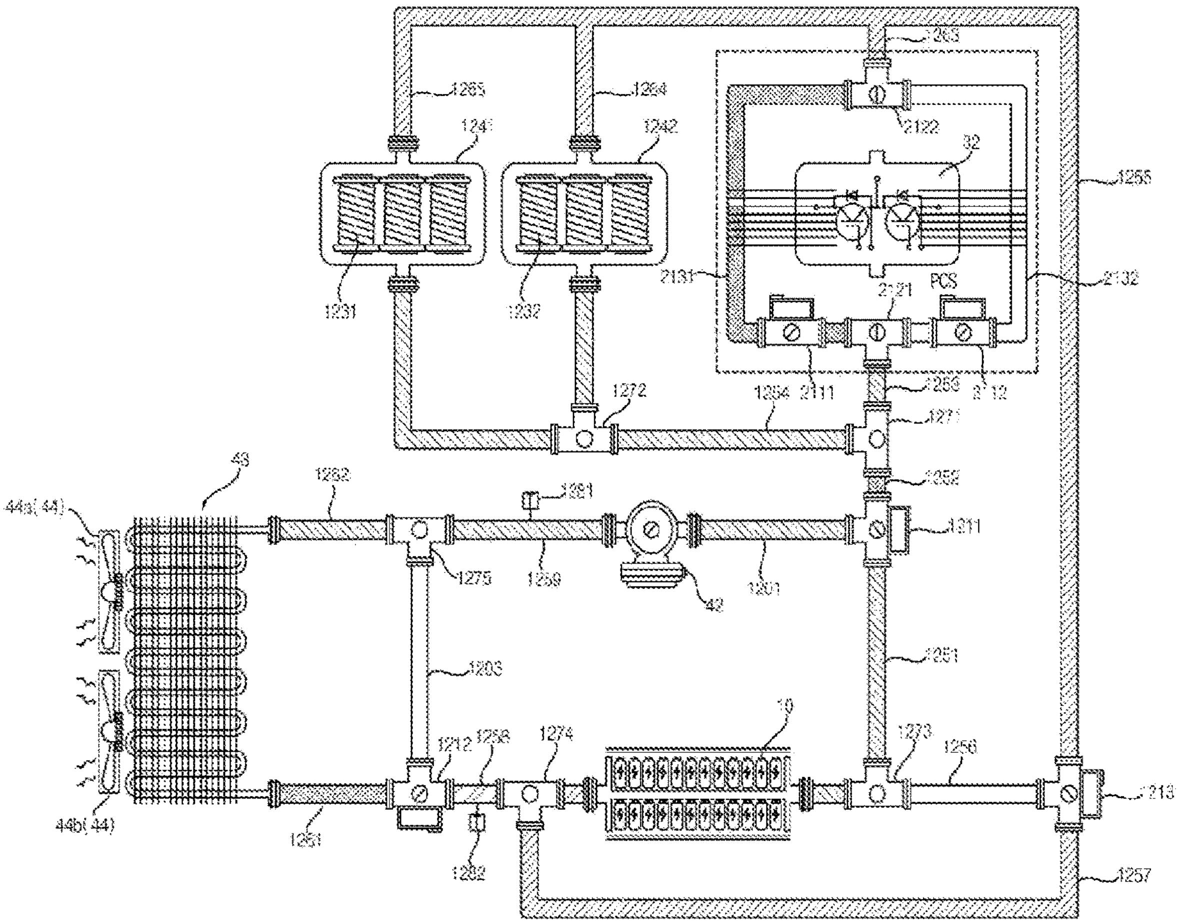
FIG. 21 is a diagram referenced in a description of a first cooling mode of an energy storage system according to an example embodiment of the present disclosure.
Figure 22:
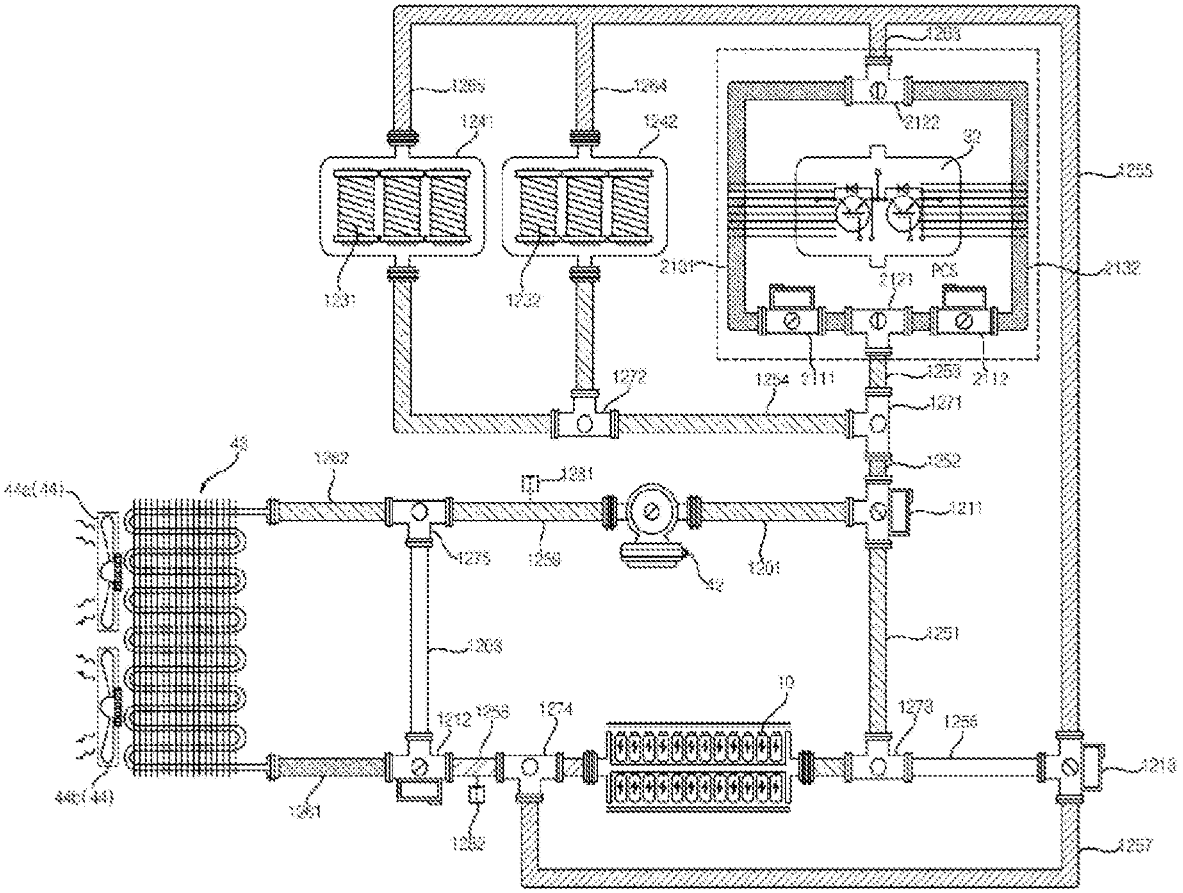
FIG. 22 is a diagram referenced in a description of a second cooling mode of an energy storage system according to an example embodiment of the present disclosure.
Figure 23:
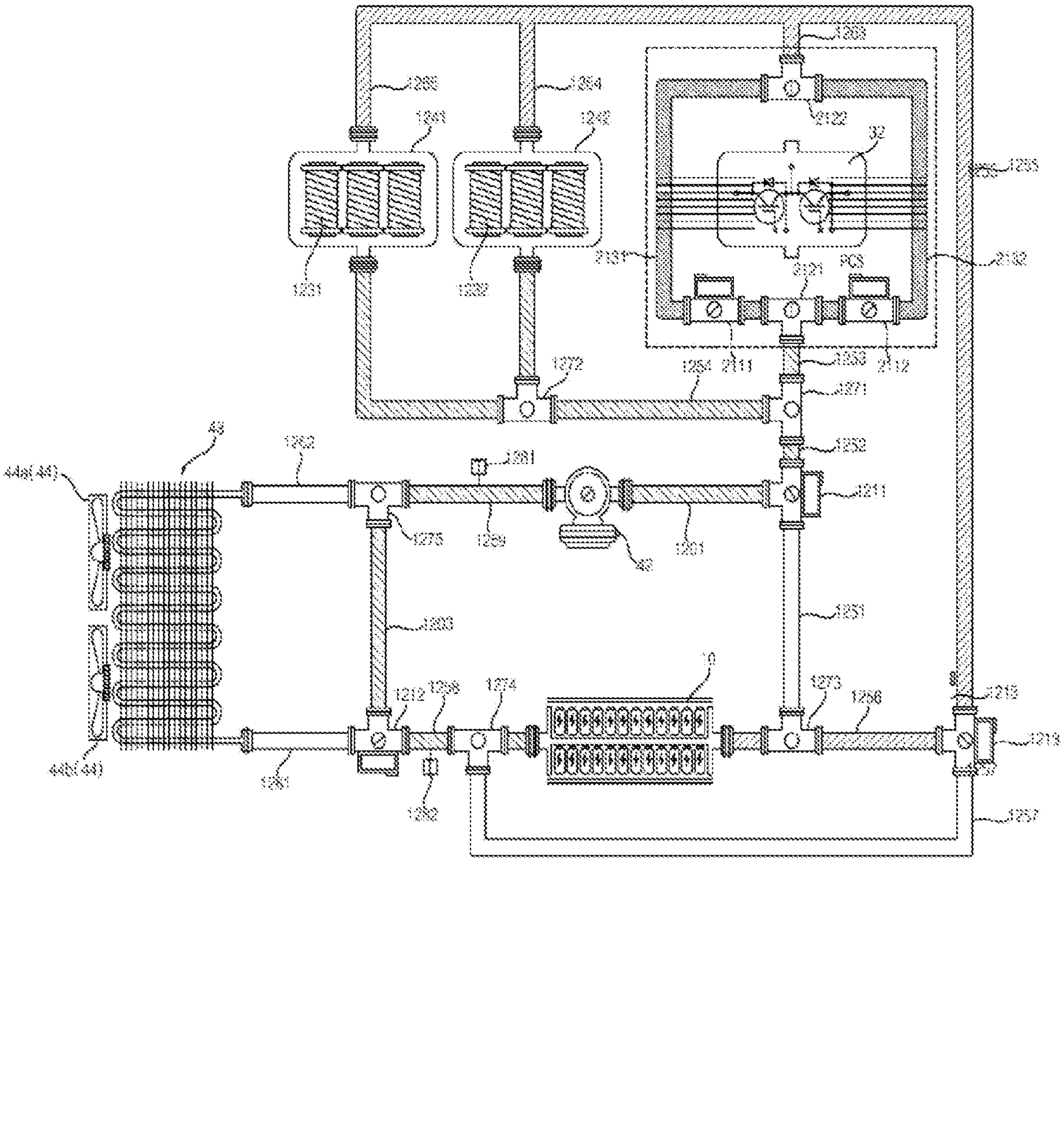
FIG. 23 is a diagram referenced in a description of a preheating mode of the energy storage system according to an embodiment of the present disclosure.

FIG. 21 is a view referenced in a description of a first cooling mode of an energy storage system according to an example embodiment. FIG. 22 is view referenced in a description of a second cooling mode of an energy storage system according to an example embodiment. FIG. 23 is a view referenced in a description of a preheating mode of an energy storage system according to an example embodiment.

Referring to FIGS. 21 to 23, the thermal management system described with reference to FIGS. 12 and 13 may additionally include a first T-type connector 2121 for distributing the coolant in the second coolant circulation paths 1252 and 1253 to the first cooling plates 1620*a* and the second cooling plates 1620*b*, a second T-type connector 2122 disposed between the second flow paths 1640*a* and 1640*b* of the first cooling plates 1620*a* and the second cooling plates 1620*b* and the fourth coolant circulation path 1255, a first valve 2111 for opening and closing a flow path through which the coolant is supplied from the first T-type connector 2121 to the first cooling plates 1620*a*, and a second valve 2112 for opening and closing a flow path through which the coolant is supplied from the first T-type connector 2121 to the second cooling plates 1620*b*.

The first flow path 1630*a* and the second flow path 1640*a* of the first cooling plates 1620*a* may be connected to a first cooling plate flow path 2131, and the first flow path 1630*b* and the second flow path 1640*b* of the second cooling plates 1620*b* may be connected to a second cooling plate flow path 2132.

Referring to FIG. 21, the pump 42 may operate and the coolant may be supplied to the first coolant circulation path 1201. In the first cooling mode, the first three-way valve 1211 may distribute the coolant supplied from the pump 42 to the second coolant circulation paths 1252 and 1253 and the third coolant circulation path 1251. That is, the first three-way valve 1211 may operate such that the coolant is supplied to both the PCS 32 and the battery pack 10.

The second three-way valve 1213 may operate such that the coolant in the fourth coolant circulation path 1255 is supplied to the bypass flow path 1257, and the third three-way valve 1212 may operate such that the coolant from the battery pack 10 and the bypass flow path 1257 is supplied to the heat exchanger 43.

Accordingly, the coolant supplied through the pump 42 may be distributed and supplied to the battery pack 10 and the PCS 32 and the reactors 1231 and 1232 through the first three-way valve 1211, the coolant that has recovered waste heat is supplied to the heat exchanger 43, and the heat dissipation fan 44 changes the fan rotation speed in response to the coolant temperature and discharges waste heat, thereby reducing the temperature of the coolant.

The cooling mode may include the first and second cooling modes. The cooling performance of the second cooling mode may be greater than that of the first cooling mode. A reference temperature in the second cooling mode may be higher than a reference temperature in the first cooling mode, and when it is necessary to cool relatively strongly, the second cooling mode may be operated. The reference temperatures used in the first and second cooling modes may be set based on a temperature measured by the PCS circuit board 33. For example, the thermal management system may operate in the first cooling mode if a temperature measured by the PCS circuit board 33 or a predetermined semiconductor device 1610 is equal to or higher than a first temperature that requires cooling and may operate in the second cooling mode if the temperature measured by the PCS circuit board 33 or the predetermined semiconductor device 1610 is equal to or higher than a second temperature higher than the first temperature.

Alternatively, the reference temperatures used in the first and second cooling modes may be set based on the coolant temperature.

Only one of the first and second cooling plates 1620*a* and 1620*b* may be operated in the first cooling mode, and both the first and second cooling plates 1620*a* and 1620*b* may be operated in the second cooling mode.

Referring to FIG. 21, in the first cooling mode, the first valve 2111 may be opened and the second valve 2112 may be closed. In the second cooling mode, both the first and second valves 2111 and 2112 may be opened.

The coolant may be independently supplied to the first cooling plates 1620*a* and the second cooling plates 1620*b* through the first and second valves 2111 and 2112.

When the heating element (semiconductor device 1610) of the PCS 32 is not maintained at a high temperature, waste heat recovered from the PCS heating element (semiconductor device 1610) can be controlled using only the first cooling plates 1620*a* by controlling the first valve 2111. When the PCS heating element (semiconductor device 1610) is in a high temperature state, waste heat of the PCS heating element (semiconductor device 1610) may be recovered as much as possible by controlling the first and second valves 2111 and 2112.

Referring to FIG. 13, in the preheating mode, the pump 42 may operate and the first three-way valve 1211 may operate such that the coolant supplied to the first coolant circulation path 1201 is supplied to the second coolant circulation paths 1252 and 1253. That is, all of the coolant supplied through the pump 42 is supplied to the PCS 32 and the reactors 1231 and 1232 through the first three-way valve 1211. Further, the first and second valves 2111 and 2112 are opened such that both the first cooling plates 1620*a* and the second cooling plates 1620*b* are used.

The second three-way valve 1213 may operate such that the coolant in the fourth coolant circulation path 1255 is supplied to the battery pack 10, and the third three-way valve 1212 may operate such that the coolant from the battery pack 10 is supplied to the pump 42.

The third three-way valve 1212 may be controlled so be switched such that the heat exchanger 43 is not used. When the PCS 32 and the reactors 1231 and 1232 operate in the preheating mode, they generate heat through reactive power control, and the low-temperature coolant supplied to the PCS 32 and the reactors 1231 and 1232 is heated. The heated coolant is supplied to the inlet side of the battery pack 10 by switching control of the second three-way valve 1213 as a medium-temperature coolant, and the medium-temperature coolant is discharged at a low temperature after preheating the battery pack 10. The preheating operation may be continued such that the battery pack 10 is preheated to a predetermined temperature or higher, and after the battery pack 10 is preheated, the energy storage system 1 enters a normal operation. After the normal operation is started, the coolant is heated by the battery pack 10 and the PCS 32 and the reactors 1231 and 1232, and thus the thermal management system enters the cooling mode operation.

Figure 24:
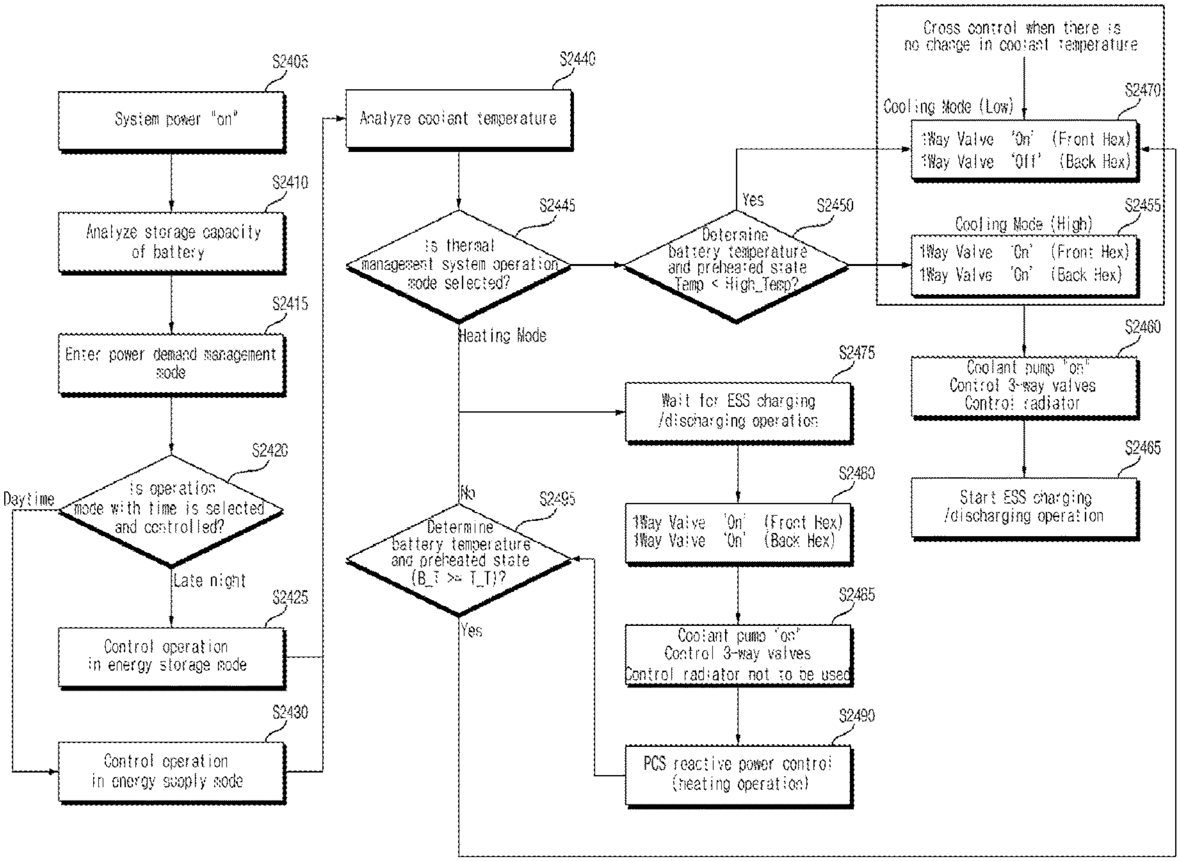
FIG. 24 is a flowchart of a method of operating the energy storage system according to an embodiment of the present disclosure.

FIG. 24 is a flowchart of a method of operating an energy storage system according to an example embodiment of the present disclosure. Referring to FIG. 24, in a state in which the energy storage system 1 is powered on (S2405), the controller may check operating conditions (S2410 to S2430) and analyze the coolant temperature detected by the temperature sensors 1281 and 1282 (S2440).

Various logics and conditions may be applied as the operating conditions of the energy storage system 1 by the manufacturer and the user. For example, the controller may analyze the storage capacity of the battery 35 (S2410) and enter a power demand management mode based on the storage capacity of the battery 35 and a load (S2415). The power demand management mode may correspond to the above-described charge/discharge mode based on a rate plan, and may be selectively controlled as an operation mode with time (S2420). In the late-night time zone when electricity rates are low, operation may be controlled in the energy storage mode in which the battery 35 is charged with power supplied from the grid 9 (S2425). During the daytime when electricity rates are high and the load is high, the operation may be controlled in the energy supply mode in which the battery 35 is discharged (S2430).

The controller may select a thermal management system operation mode based on the coolant temperature (S2445). Additionally, the controller may select a thermal management system operation mode based on a temperature measured at the PCS circuit board 33 or a predetermined semiconductor device 1610 (S2450).

When cooling is required, the controller may control the thermal management system in the cooling mode (S2470 and S2455).

If the temperature measured at the PCS circuit board 33 or the predetermined semiconductor device 1610 is lower than a high temperature reference value High_Temp, the thermal management system may operate in the first cooling mode (S2470). If the temperature measured at the PCS circuit board 33 or the predetermined semiconductor device 1610 is not lower than the high temperature reference value High_Temp, the thermal management system may operate in the second cooling mode (S2455).

In the first cooling mode (S2470), the first valve 2111 is opened and the second valve 2112 is closed such that only the first cooling plates 1620*a* can be used, as shown in FIG. 21. At this time, if there is no change in the coolant temperature, the first valve 2111 may be closed and the second valve 2112 may be opened.

In the second cooling mode (S2455), both the first valve 2111 and the second valve 2112 may be opened, as shown in FIG. 22.

In the first and second cooling modes (S2470 and S2455), the pump may be turned on and the three-way valves 1211, 1212, and 1213 may be controlled, as shown in FIGS. 21 and 22. A radiator including the heat exchanger 43 and the heat dissipation fan 44 may be controlled, as shown in FIGS. 21 and 22 (S2460).

In a state in which the thermal management system operates in the cooling mode, the energy storage system 1 may perform a normal charging or discharging operation (S2465).

The thermal management system may operate in a heating mode for preheating the battery 35 (S2475 to S2490). The energy storage system 1 may wait by delaying or stopping the start of charging or discharging (S2475).

In the heating mode, the pump 42 is turned on and the three-way valves 1211, 1212, and 1213 may be controlled, as shown in FIG. 23. The radiator including the heat exchanger 43 and the heat dissipation fan 44 may be controlled, as shown in FIG. 23 (S2485). In a state in which the thermal management system operates in the heating mode, the PCS 32 and the reactors 1231 and 1232 may generate heat through reactive power control in the case of the preheating mode operation, the coolant may circulate, and the battery 35 may be preheated (S2490).

On the other hand, if the battery 35 is preheated and thus the battery temperature B_T is equal to or higher than a preheating reference temperature T_T (S2495), the energy storage system 1 starts or resumes charging/discharging of the battery to perform normal operation, and the thermal management system may be controlled in the first cooling mode (S2470).

If the battery 35 is not sufficiently preheated and thus the battery temperature B_T is lower than the preheating reference temperature (S2450), the thermal management system is controlled to enter an operation mode in which the battery pack is continuously preheated (S2475 to S2490).

While the present disclosure has been particularly shown and described with reference to exemplary embodiments thereof, it will be understood by those of ordinary skill in the art that various changes in form and detail may be made herein without departing from the spirit and scope of the present disclosure as defined by the following claims and such modifications and variations should not be understood individually from the technical idea or aspect of the present disclosure.

In the cooling structure of Korean Patent Application No. 1020150189485, the coolant flow path is short, the amount of waste heat recovery is small, and the PCB size and shape are limited due to interference of the coolant supply inlet and outlet.

An object of the present disclosure is to provide an energy storage system for effectively managing heat generated from a power conditioning system by applying cooling plates.

Another object of the present disclosure is to provide an energy storage system capable of improving power conversion efficiency.

Another object of the present disclosure is to provide an energy storage system for preventing overheating of a circuit board.

Another object of the present disclosure is to provide an energy storage system capable of improving reliability of cooling performance by increasing the amount of waste heat recovery.

The objects of the present disclosure are not limited to the objects mentioned above, and other objects which are not mentioned will be clearly understood by those skilled in the art from the following description.

To accomplish the aforementioned objects, an energy storage system according to embodiments of the present disclosure can effectively manage the temperature of semiconductor devices of a power conditioning system using cooling plates in contact with semiconductor devices of a power conditioning system.

To accomplish the aforementioned objects, in the energy storage system according to embodiments of the present disclosure, an area in which a coolant is introduced can be formed to be wider than an area in which the coolant is discharged after heat recovery in a contact area where internal flow paths of the cooling plates are in contact with semiconductor devices, thereby improving cooling efficiency.

To accomplish the aforementioned objects, in the energy storage system according to embodiments of the present disclosure, cooling performance can be improved by forming internal flow paths of the cooling plates in contact with the semiconductor devices are formed such that a coolant flow rate decreases in the contact area.

To accomplish the aforementioned objects, in the energy storage system according to embodiments of the present disclosure, the internal flow paths of the cooling plates in contact with the semiconductor devices can be formed to be wider in the contact area than in other areas, thereby lowering a flow rate and generating a vortex to improve cooling performance.

To accomplish the aforementioned objects, in the energy storage system according to embodiments of the present disclosure, the internal flow paths of the cooling plates in contact with semiconductor devices are formed such that they pass through the contact area a plurality of times, thereby improving cooling performance.

An energy storage system according to an embodiment of the present disclosure includes a plurality of cooling plates disposed in contact with the plurality of semiconductor devices on a power conditioning system (PCS) circuit board, a cooling module including a pump for flowing a coolant, a first flow path connected to the plurality of cooling plates and the cooling module, through which a coolant discharged from the cooling module flows, and a second flow path connected to the plurality of cooling plates and the cooling module, through which the coolant discharged from the plurality of cooling plates flows, wherein each of the plurality of cooling plates includes an internal flow path including a first channel connected to the first flow path and a second channel connected to the first channel and the second flow path, and an area occupied by the first channel is larger than an area occupied by the second channel in a first area in contact with the semiconductor devices.

A coolant flow rate of the first channel may be lower than a flow rate of the second channel in the first area.

The first channel may be formed to be wider in the first area than in other areas.

The first channel may be formed such that it passes through the first area a plurality of times.

The first and second flow paths may be disposed on one side of the semiconductor devices.

The plurality of cooling plates may be divided into the first area, a second area between the first area and the first and second flow paths, and a remaining third area, and the third area may have a largest area.

The cooling module may further include a heat exchanger for exchanging heat of the coolant flowing by the pump with air, and a heat dissipation fan for supplying external air to the heat exchanger.

The cooling module may further include a temperature sensor for sensing a temperature of the coolant, and the heat dissipation fan may have a rotation speed variable in response to the temperature of the coolant.

The energy storage system according to an embodiment of the present disclosure may further include a first coolant circulation path through which the coolant is supplied from the pump, a second coolant circulation path branched from the first coolant circulation path, through which the coolant is supplied to the first flow path, a third coolant circulation path branched from the first coolant circulation path, through which the coolant is supplied to the battery pack, a fourth coolant circulation path through which the coolant from the second flow path flows, a fifth coolant circulation path branched from the fourth cooling circulation path, through which the coolant is supplied to the battery pack, and a bypass flow path branched from the fourth coolant circulation path, through which the coolant is supplied to the heat exchanger.

The energy storage system according to an embodiment of the present disclosure may further include a first three-way valve for distributing the coolant in the first coolant circulation path to the second coolant circulation path and the third coolant circulation path, a second three-way valve operating such that the coolant in the fourth coolant circulation path is selectively supplied to the fifth coolant circulation path or the bypass flow path, and a third three-way valve operating such that the coolant from the battery pack and the bypass flow path is supplied to the heat exchanger or the pump.

In a cooling mode, the pump may operate, the first three-way valve may distribute the coolant supplied from the pump to the second coolant circulation path and the third coolant circulation path, the second three-way valve may operate such that the coolant in the fourth coolant circulation path is supplied to the bypass flow path, and the third three-way valve may operate such that the coolant from the battery pack and the bypass flow path is supplied to the heat exchanger.

In a preheating mode, the pump may operate, the first three-way valve may operate such that the coolant supplied from the pump is supplied to the second coolant circulation path, the second three-way valve may operate such that the coolant in the fourth coolant circulation path is supplied to the battery pack, and the third three-way valve may operate such that the coolant from the battery pack is supplied to the pump.

The energy storage system according to an embodiment of the present disclosure may further include a reactor, a reactor water block in contact with the reactor, a T-type connector disposed in the second coolant circulation path to distribute the coolant to the reactor water block.

The plurality of cooling plates may include first cooling plates in contact with front surfaces of the plurality of semiconductor devices and second cooling plates in contact with rear surfaces of the plurality of semiconductor devices.

The first and second flow paths connected to the first cooling plates are disposed on opposite sides of first and second flow paths connected to the second cooling plates with respect to the semiconductor devices.

The energy storage system according to an embodiment of the present disclosure may further include a first coolant circulation path through which the coolant is supplied from the pump, a second coolant circulation path branched from the first coolant circulation path, through which the coolant is supplied to the first flow path, a T-type connector for distributing the coolant in the second coolant circulation path to the first cooling plates and the second cooling plates, a third coolant circulation path branched from the first coolant circulation path, through which the coolant is supplied to the battery pack, a fourth coolant circulation path through which the coolant from the second flow path flows, a fifth coolant circulation path branched from the fourth coolant circulation path, through which the coolant is supplied to the battery pack, and a bypass flow path branched from the fourth coolant circulation path, through which the coolant is supplied to the heat exchanger.

The energy storage system according to an embodiment of the present disclosure may further include a T-type connector disposed between second flow paths of the first cooling plates and the second cooling plates and the fourth coolant circulation path.

The energy storage system according to an embodiment of the present disclosure may further include a first three-way valve for distributing the coolant in the first coolant circulation path to the second coolant circulation path and the third coolant circulation path, a second three-way valve operating such that the coolant in the fourth coolant circulation path is selectively supplied to the fifth coolant circulation path or the bypass flow path, a third three-way valve operating such that the coolant from the battery pack and the bypass flow path is selectively supplied to the heat exchanger or the pump, a first valve for opening and closing a flow path through which the coolant is supplied from the T-type connector to the first cooling plates, and a second valve for opening and closing a flow path through which the coolant is supplied from the T-type connector to the second cooling plates.

In a first cooling mode, the pump may operate, the first three-way valve may distribute the coolant supplied from the pump to the second coolant circulation path and the third coolant circulation path, the second three-way valve may operate such that the coolant in the fourth coolant circulation path is supplied to the bypass flow path, the third three-way valve may operate such that the coolant from the battery pack and the bypass flow path is supplied to the heat exchanger, the first valve may be opened, and the second valve may be closed.

In a second cooling mode, the pump may operate, the first three-way valve may distribute the coolant supplied from the pump to the second coolant circulation path and the third coolant circulation path, the second three-way valve may operate such that the coolant in the fourth coolant circulation path is supplied to the bypass flow path, the third three-way valve may operate such that the coolant from the battery pack and the bypass flow path is supplied to the heat exchanger, and the first and second valves may be opened.

A reference temperature in the second cooling mode may be higher than a reference temperature in the first cooling mode.

In the preheating mode, the pump may operate, the first three-way valve may operate such that the coolant supplied from the pump is supplied to the second coolant circulation path, the second three-way valve may operate such that the coolant in the fourth coolant circulation path is supplied to the battery pack, the third three-way valve may operate such that the coolant from the battery pack is supplied to the pump, and the first and second valves may be opened.

The energy storage system according to an embodiment of the present disclosure may further include a reactor, a reactor water block in contact with the reactor, and a T-type connector disposed in the second coolant circulation path to distribute the coolant to the reactor water block.

According to at least one of the embodiments of the present disclosure, it is possible to stably manage the temperature of a power management system and semiconductor devices on a power management system circuit board.

In addition, according to at least one of the embodiments of the present disclosure, the energy storage system capable of improving power conversion efficiency is provided.

In addition, according to at least one of the embodiments of the present disclosure, it is possible to prevent overheating of the power management system circuit board.

In addition, according to at least one of the embodiments of the present disclosure, it is possible to increase the amount of waste heat recovered from semiconductor devices to improve the reliability of cooling performance.

Meanwhile, various other effects will be disclosed directly or implicitly in the detailed description according to the embodiments of the present disclosure which will be described later.

It will be understood that when an element or layer is referred to as being "on" another element or layer, the element or layer can be directly on another element or layer or intervening elements or layers. In contrast, when an element is referred to as being "directly on" another element or layer, there are no intervening elements or layers present. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section could be termed a second element, component, region, layer or section without departing from the teachings of the present invention.

Spatially relative terms, such as "lower", "upper" and the like, may be used herein for ease of description to describe the relationship of one element or feature to another element(s) or feature(s) as illustrated in the figures. It will be understood that the spatially relative terms are intended to encompass different orientations of the device in use or operation, in addition to the orientation depicted in the figures. For example, if the device in the figures is turned over, elements described as "lower" relative to other elements or features would then be oriented "upper" relative to the other elements or features. Thus, the exemplary term "lower" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Embodiments of the disclosure are described herein with reference to cross-section illustrations that are schematic illustrations of idealized embodiments (and intermediate structures) of the disclosure. As such, variations from the shapes of the illustrations as a result, for example, of manufacturing techniques and/or tolerances, are to be expected. Thus, embodiments of the disclosure should not be construed as limited to the particular shapes of regions illustrated herein but are to include deviations in shapes that result, for example, from manufacturing.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

Any reference in this specification to “one embodiment,” “an embodiment,” “example embodiment,” etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A cooling system comprising:

a plurality of cooling plates disposed to contact a plurality of semiconductor devices;

a cooling module including a pump for flowing a coolant;

a first flow path to couple to the cooling module and to the plurality of cooling plates, and configured to flow the coolant from the cooling module to the plurality of cooling plates; and a second flow path to couple to the plurality of cooling plates and to the cooling module, and configured to flow the coolant from the plurality of cooling plates to the cooling module, wherein each of the plurality of cooling plates includes an internal flow path formed by a first channel to couple to the first flow path and a second channel to couple to the first channel and to the second flow path, and each of the cooling plates separately includes a first area in which the cooling plate contacts one of the semiconductor devices, the first area includes a first sub-area occupied by the first channel and a second sub-area occupied by the second channel, and the first sub-area is larger than the second sub-area.

2. The cooling system of claim 1, wherein a width of the first channel at the first area is greater than a width of the first channel at other areas of the cooling plate.

3. The cooling system of claim 1, wherein the first channel is to pass through the first area a plurality of times.

4. The cooling system of claim 1, wherein a coolant flow rate through the first channel at the first area is less than a coolant flow rate through the second channel at the first area.

5. The cooling system of claim 1, wherein the first and second flow paths are disposed on one side of the semiconductor devices.

6. The cooling system of claim 5, wherein each of the plurality of cooling plates is separately divided into the first area, a second area between the first area and an end of the cooling plate corresponding to the first and second flow paths, and a remaining third area, and the third area has a largest area of the corresponding cooling plate.

7. The cooling system of claim 1, wherein the cooling module comprises:

a heat exchanger configured to exchange heat of the coolant with air; and a heat dissipation fan configured to supply external air to the heat exchanger.

8. The cooling system of claim 7, wherein the cooling module comprises a temperature sensor configured to sense a temperature of the coolant, and a rotation speed of the heat dissipation fan is variable based on the sensed temperature of the coolant.

9. An energy storage system comprising:

a plurality of switching devices configured to charge or discharge at least one battery;

a plurality of cooling structures disposed to contact the plurality of switching devices;

a cooling module that includes a pump for flowing a coolant;

a first flow path to couple to the cooling module and to the plurality of cooling structures, and configured to guide the coolant from the cooling module to the plurality of cooling structures; and a second flow path to couple to the plurality of cooling structures and to the cooling module, and configured to guide the coolant from the plurality of cooling structures to the cooling module, wherein each of the plurality of cooling structures includes an internal flow path having a first channel to couple to the first flow path and a second channel to couple to the second flow path, and each of the cooling structures separately includes a first area in which the cooling structure contacts one of the switching devices, the first area includes a first sub-area corresponding to the first channel and a second sub-area corresponding to the second channel, and the first sub-area is larger than the second sub-area.

* * * * *